(12) United States Patent
Raymond et al.

(10) Patent No.: US 10,505,079 B2
(45) Date of Patent: Dec. 10, 2019

(54) FLEXIBLE DEVICES AND METHODS USING LASER LIFT-OFF

(71) Applicant: X-Celeprint Limited, Cork (IE)

(72) Inventors: Brook Raymond, Cary, NC (US); Christopher Andrew Bower, Raleigh, NC (US); Ronald S. Cok, Rochester, NY (US); Matthew Meitl, Durham, NC (US)

(73) Assignee: X-Celeprint Limited, Cork (IE)

( * ) Notice: Subject to any disclaimer, the term of this patent is extended or adjusted under 35 U.S.C. 154(b) by 0 days.

(21) Appl. No.: 15/975,656

(22) Filed: May 9, 2018

(65) Prior Publication Data
US 2019/0348573 A1    Nov. 14, 2019

(51) Int. Cl.
*H01L 33/48* (2010.01)
*H01L 33/54* (2010.01)
*H01L 25/13* (2006.01)
*H01L 33/00* (2010.01)

(52) U.S. Cl.
CPC ........... *H01L 33/483* (2013.01); *H01L 25/13* (2013.01); *H01L 33/0095* (2013.01); *H01L 33/54* (2013.01); *H01L 2933/0033* (2013.01)

(58) Field of Classification Search
None
See application file for complete search history.

(56) References Cited

U.S. PATENT DOCUMENTS

| 6,142,358 | A  | 11/2000 | Cohn et al. |
| 6,969,624 | B2 | 11/2005 | Iwafuchi et al. |
| 7,195,733 | B2 | 3/2007  | Rogers et al. |

(Continued)

FOREIGN PATENT DOCUMENTS

| JP | 2011066130 A   | 3/2011 |
| WO | WO-2010/111601 A2 | 9/2010 |
| WO | WO-2011/123285 A1 | 10/2011 |

OTHER PUBLICATIONS

Bower, C. A. et al., Transfer Printing: An Approach for Massively Parallel Assembly of Microscale Devices, IEE, Electronic Components and Technology Conference, (2008).

(Continued)

*Primary Examiner* — Alexander G Ghyka
(74) *Attorney, Agent, or Firm* — William R. Haulbrook; Michael D. Schmitt; Choate, Hall & Stewart LLP

(57) ABSTRACT

A method of making a flexible device comprises providing a rigid substrate and a flexible substrate, disposing a layer of print adhesive on the rigid substrate, and micro-transfer printing micro-devices onto the print adhesive. Each of the micro-devices comprises a micro-device substrate separate, independent, and distinct from the rigid substrate and from the flexible substrate. A bonding layer is provided to bond the flexible substrate to the micro-devices such that (i) the bonding layer is disposed between the flexible substrate and the micro-devices and (ii) the micro-devices are disposed between the rigid substrate and the flexible substrate (e.g., forming a device structure). The flexible substrate is separated from the rigid substrate so that the micro-devices remain bonded to the flexible substrate providing a flexible device. The micro-devices can comprise at least a portion of a micro-device tether.

21 Claims, 15 Drawing Sheets

(56) References Cited

U.S. PATENT DOCUMENTS

| | | |
|---|---|---|
| 7,354,801 B2 | 4/2008 | Sugiyama et al. |
| 7,399,693 B2 | 7/2008 | Sekiguchi et al. |
| 7,521,292 B2 | 4/2009 | Rogers et al. |
| 7,557,367 B2 | 7/2009 | Rogers et al. |
| 7,622,367 B1 | 11/2009 | Nuzzo et al. |
| 7,662,545 B2 | 2/2010 | Nuzzo et al. |
| 7,704,684 B2 | 4/2010 | Rogers et al. |
| 7,799,699 B2 | 9/2010 | Nuzzo et al. |
| 7,927,976 B2 | 4/2011 | Menard |
| 7,932,123 B2 | 4/2011 | Rogers et al. |
| 7,943,491 B2 | 5/2011 | Nuzzo et al. |
| 7,972,875 B2 | 7/2011 | Rogers et al. |
| 7,982,296 B2 | 7/2011 | Nuzzo et al. |
| 8,039,847 B2 | 10/2011 | Nuzzo et al. |
| 8,198,621 B2 | 6/2012 | Rogers et al. |
| 8,207,547 B2 | 6/2012 | Lin |
| 8,261,660 B2 | 9/2012 | Menard |
| 8,394,706 B2 | 3/2013 | Nuzzo et al. |
| 8,440,546 B2 | 5/2013 | Nuzzo et al. |
| 8,470,701 B2 | 6/2013 | Rogers et al. |
| 8,506,867 B2 | 8/2013 | Menard |
| 8,558,243 B2 | 10/2013 | Bibl et al. |
| 8,664,699 B2 | 3/2014 | Nuzzo et al. |
| 8,722,458 B2 | 5/2014 | Rogers et al. |
| 8,754,396 B2 | 6/2014 | Rogers et al. |
| 8,791,474 B1 | 7/2014 | Bibl et al. |
| 8,794,501 B2 | 8/2014 | Bibl et al. |
| 8,835,940 B2 | 9/2014 | Hu et al. |
| 8,865,489 B2 | 10/2014 | Rogers et al. |
| 8,877,648 B2 | 11/2014 | Bower et al. |
| 8,889,485 B2 | 11/2014 | Bower |
| 8,895,406 B2 | 11/2014 | Rogers et al. |
| 8,934,259 B2 | 1/2015 | Bower et al. |
| 8,941,215 B2 | 1/2015 | Hu et al. |
| 9,105,714 B2 | 8/2015 | Hu et al. |
| 9,111,464 B2 | 8/2015 | Bibl et al. |
| 9,139,425 B2 | 9/2015 | Vestyck |
| 9,161,448 B2 | 10/2015 | Menard et al. |
| 9,166,114 B2 | 10/2015 | Hu et al. |
| 9,178,123 B2 | 11/2015 | Sakariya et al. |
| 9,217,541 B2 | 12/2015 | Bathurst et al. |
| 9,240,397 B2 | 1/2016 | Bibl et al. |
| 9,252,375 B2 | 2/2016 | Bibl et al. |
| 9,355,854 B2 | 5/2016 | Meitl et al. |
| 9,358,775 B2 | 6/2016 | Bower et al. |
| 9,412,727 B2 | 8/2016 | Menard et al. |
| 9,478,583 B2 | 10/2016 | Hu et al. |
| 9,520,537 B2 | 12/2016 | Bower et al. |
| 9,555,644 B2 | 1/2017 | Rogers et al. |
| 9,583,533 B2 | 2/2017 | Hu et al. |
| 9,601,356 B2 | 3/2017 | Bower et al. |
| 9,640,715 B2 | 5/2017 | Bower et al. |
| 9,716,082 B2 | 7/2017 | Bower et al. |
| 9,761,754 B2 | 9/2017 | Bower et al. |
| 9,765,934 B2 | 9/2017 | Rogers et al. |
| 9,929,053 B2 | 3/2018 | Bower et al. |
| 2007/0173034 A1 | 7/2007 | Tsurume et al. |
| 2013/0273695 A1 | 10/2013 | Menard et al. |
| 2016/0020131 A1 | 1/2016 | Bower et al. |
| 2016/0093600 A1 | 3/2016 | Bower et al. |
| 2016/0233269 A1* | 8/2016 | Choi .................... H01L 33/007 |
| 2017/0025484 A1* | 1/2017 | Forrest .................. H01L 51/56 |
| 2017/0256521 A1 | 9/2017 | Cok et al. |
| 2017/0338374 A1 | 11/2017 | Zou et al. |

OTHER PUBLICATIONS

Cok, R. S. et al., 60.3: AMOLED Displays Using Transfer-Printed Integrated Circuits, Society for Information Display, 10:902-904, (2010).

Cok, R. S. et al., AMOLED displays with transfer-printed integrated circuits, Journal of the SID, 19(4):335-341, (2011).

Cok, R. S. et al., Inorganic light-emitting diode displays using micro-transfer printing, Journal of the SID, 25(10):589-609, (2017).

Feng, X. et al., Competing Fracture in Kinetically Controlled Transfer Printing, Langmuir, 23(25):12555-12560, (2007).

Gent, A.N., Adhesion and Strength of Viscoelastic Solids. Is There a Relationship between Adhesion and Bulk Properties?, American Chemical Society, Langmuir, 12(19):4492-4496, (1996).

Kim, Dae-Hyeong et al., Optimized Structural Designs for Stretchable Silicon Integrated Circuits, Small, 5(24):2841-2847, (2009).

Kim, Dae-Hyeong et al., Stretchable and Foldable Silicon Integrated Circuits, Science, 320:507-511, (2008).

Kim, S. et al., Microstructural elastomeric surfaces with reversible adhesion and examples of their use in deterministic assembly by transfer printing, PNAS, 107(40):17095-17100 (2010).

Kim, T. et al., Kinetically controlled, adhesiveless transfer printing using microstructured stamps, Applied Physics Letters, 94(11):113502-1-113502-3, (2009).

Meitl, M. A. et al., Transfer printing by kinetic control of adhesion to an elastomeric stamp, Nature Material, 5:33-38, (2006).

Michel, B. et al., Printing meets lithography: Soft approaches to high-resolution patterning, J. Res. & Dev. 45(5):697-708, (2001).

Roscher, H., VCSEL Arrays with Redundant Pixel Designs for 10Gbits/s 2-D Space-Parallel MMF Transmission, Annual Report, optoelectronics Department, (2005).

Trindade, A. J. et al., Precision transfer printing of ultra-thin AlInGaN micron-size light-emitting diodes, Crown, 978-1-4577-1507-5/13:217-218 (2012).

* cited by examiner

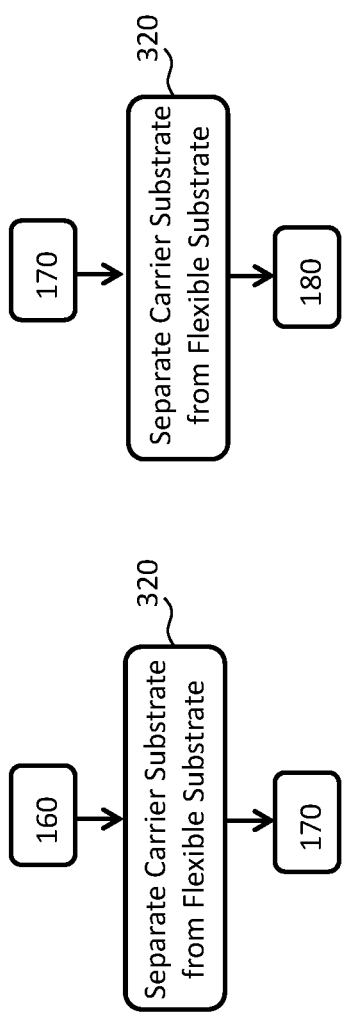
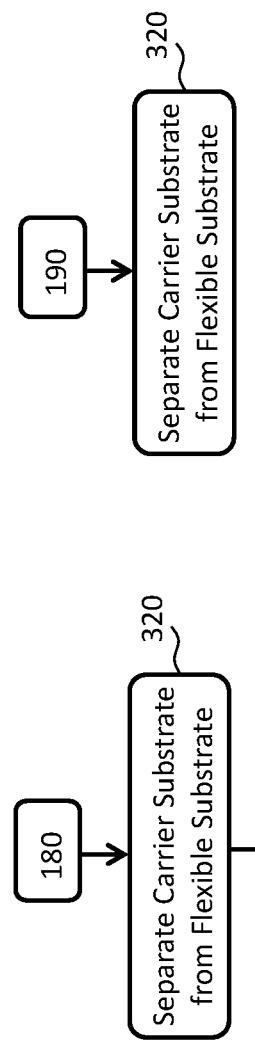
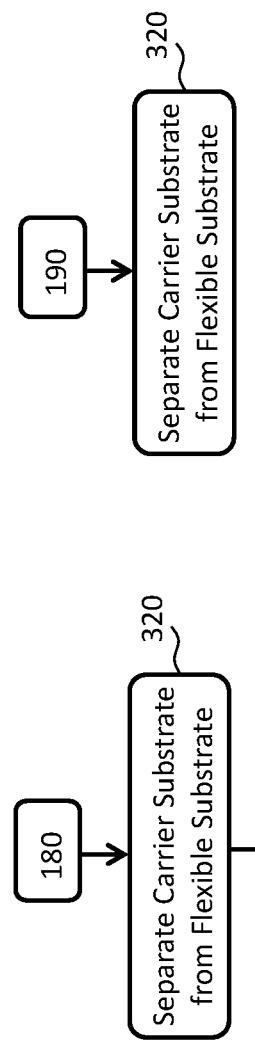
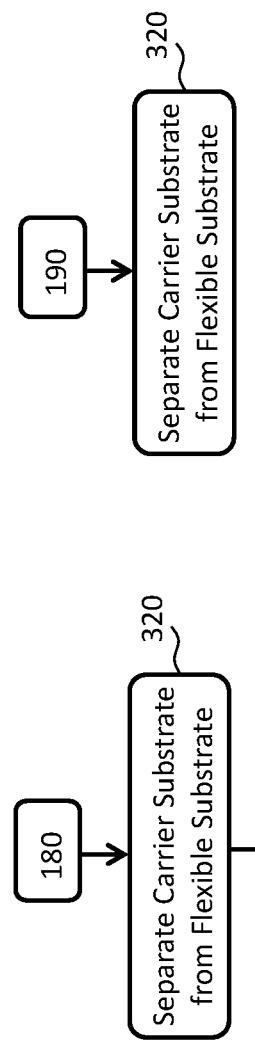
FIG. 6A
FIG. 6B
FIG. 6C
FIG. 6D

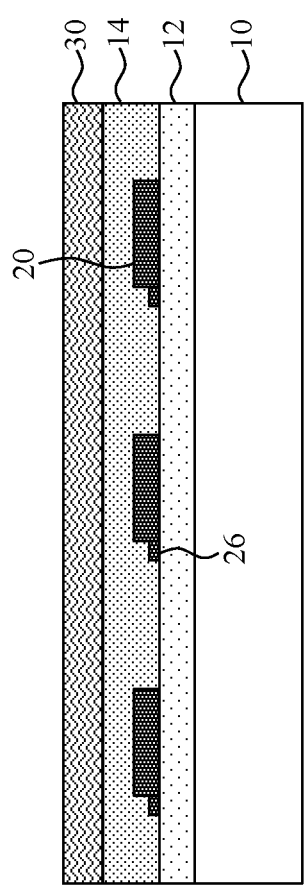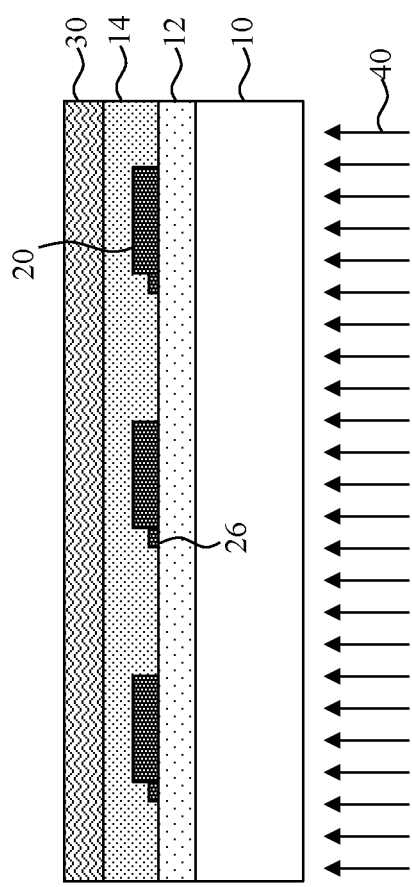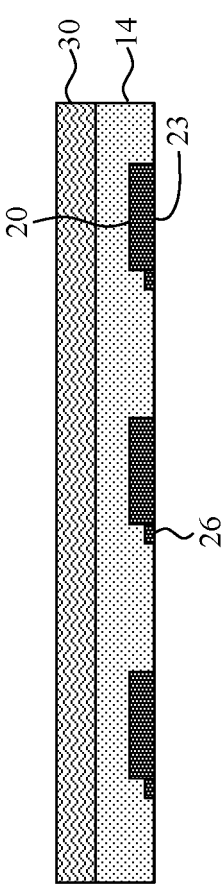

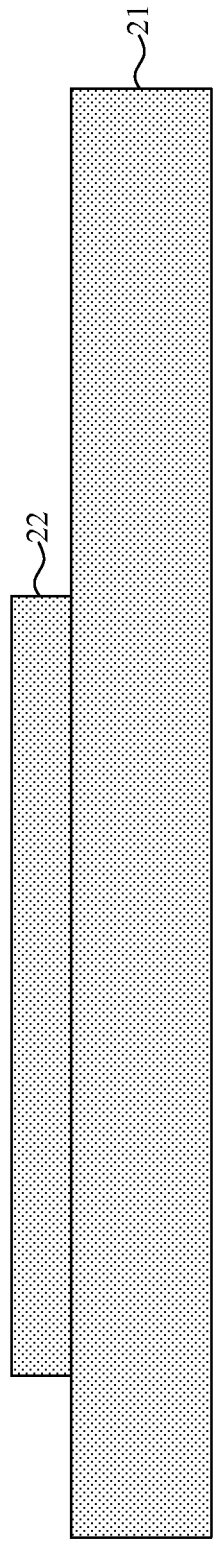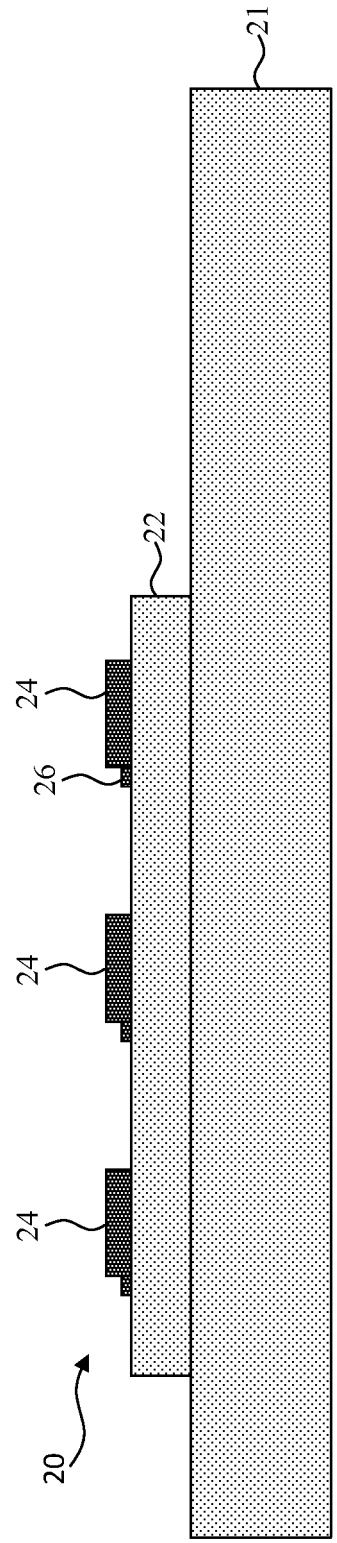
FIG. 11A
FIG. 11B

FLEXIBLE DEVICES AND METHODS USING LASER LIFT-OFF

TECHNICAL FIELD

The present invention relates generally to structures and methods for flexible devices, such as displays, constructed using transfer printing (e.g., micro-transfer printing).

BACKGROUND

Electronic and optical systems typically include a variety of electronic or optical components assembled on a substrate. For example, integrated circuits, resistors, capacitors, discrete transistors, inductors, voltage regulators, and electrical connectors are often mounted together on printed-circuit boards. As electronic and optical systems become smaller and more highly integrated, ever-smaller components must be assembled on substrates. For example, surface-mount components as small as 400 microns in length can be assembled on circuit boards using pick-and-place equipment.

Electronic and optical components are usually constructed on wafers using photolithographic methods and materials. Different wafer materials are well-suited for different device types, for example silicon wafers are used to make digital integrated circuits and sapphire or SiC substrates are commonly used with light-emitting diodes. Individual components can be removed from their native substrate, for example by dicing the wafer, packaging the components, and assembling the packaged components on a printed circuit board. However, such components and methods are most useful with relatively large electrical devices, for example greater than 200 microns, 500 microns, or 1 mm in a dimension.

Alternatively, devices such as light-emitting diodes (LEDs) are removed from their native substrate by laser lift off, for example as described in *Large-area laser-lift-off processing in microelectronics*, by Delmdahl et al. in Physics Procedia 41 (2013) pp. 241-248. This work describes UV laser lift-off delamination using 248 nm excimer laser sources to remove GaN LEDs from sapphire substrates. These devices must still be placed after lift-off.

Flexible electronic systems typically include a variety of electrical devices, either rigid or flexible, disposed on a flexible substrate. The flexible substrates can be very thin, for example less than 200 microns thick. Since equipment used in fabrication, for example photolithographic processing equipment, often relies on flat, rigid substrates in their manufacturing processes, one approach to making flexible electronic equipment relies on temporarily adhering a flexible substrate to a rigid substrate carrier, for example as also described in Delmdahl et al. in FIG. 3. After the processing and construction is completed, the rigid substrate carrier is removed or separated from the flexible substrate, leaving the electrical devices on the flexible substrate. However, for very small electrical devices, for example less than 200 microns in a dimension, it can be difficult to align and adhere the electrical devices with sufficient alignment accuracy on the flexible substrate or on an adhesive layer provided on the flexible substrate. For example, some photolithographic processes require heat and the coefficient of thermal expansion for a flexible substrate such as PEN or PET is much higher than the coefficient of thermal expansion of rigid substrates such as glass, quartz, silicon, or ceramics, making alignment much more difficult on the flexible substrate, especially for larger substrates such as those found in displays. Such rigid substrates can be four to twenty times more dimensionally stable than flexible substrates such as plastics.

In another approach to making flexible electronic devices, a flexible substrate is adhered directly to a native semiconductor wafer comprising the electrical devices, for example as described in Delmdahl et al. in FIG. 7 for a metal wafer. The electrical devices are removed from the native semiconductor wafer, for example by grinding the native semiconductor wafer, etching, or laser ablation. However, this approach limits the variety of electrical devices on the flexible substrate to those found on a single semiconductor wafer.

Small micro-devices having dimensions less than 100 microns, for example, can be assembled using micro-transfer printing techniques. For example, U.S. Pat. No. 8,722,458 describes transferring light-emitting, light-sensing, or light-collecting semiconductor elements from a wafer substrate to a destination substrate using a patterned elastomer stamp whose spatial pattern matches the location of the semiconductor elements on the wafer substrate. Small integrated circuit chips or chiplets are typically formed on a native silicon substrate using photolithographic processes. The silicon substrate facilitates the formation of anchors on the wafer and tethers between the wafer and the chiplet that are broken or separated during an exemplary micro-transfer printing process.

Micro-transfer printing can be used with a wide variety of component types in a wide variety of electronic and optical system, including processors, sensors, and energy emitters such as light-emitting diodes (LEDs). For example, CMOS devices are typically formed in silicon wafers, high-power transistors are often made using compound semiconductors such as gallium arsenide, and light-emitting devices such as light-emitting diodes are constructed in doped compound semiconductors such as gallium nitride, gallium phosphide, or gallium arsenide. These various components require a corresponding variety of materials and processing methods for making micro-transfer printable devices that can be directly micro-transfer printed from a native source substrate or wafer to a destination substrate. Devices that are not directly micro-transfer printed from a native wafer can be alternatively bonded to a handle wafer (for example as taught in U.S. Pat. No. 8,934,259) or transferred using two stamp transfer steps (for example as taught in U.S. Pat. No. 8,889,485).

There is a need, therefore, for methods and materials for constructing flexible electronic devices comprising a variety of different small electrical or opto-electronic devices at a high resolution and with improved accuracy.

SUMMARY

According to some embodiments of the present invention, a method of making a flexible device comprises providing a rigid substrate and a flexible substrate, disposing a layer of print adhesive on the rigid substrate, micro-transfer printing micro-devices onto the print adhesive, wherein each of the micro-devices comprises a micro-device substrate separate, independent, and distinct from the rigid substrate and from the flexible substrate, providing a bonding layer, bonding the flexible substrate to the micro-devices with the bonding layer such that (i) the bonding layer is disposed between the flexible substrate and the micro-devices and (ii) the micro-devices are disposed between the rigid substrate and the flexible substrate, and separating the flexible substrate from the rigid substrate so that the micro-devices remain bonded to the flexible substrate.

In some embodiments, separating the flexible substrate from the rigid substrate comprises exposing the print adhesive to electromagnetic radiation and dissociating the rigid substrate from the micro-devices, bonding layer, and from the bonded flexible substrate.

In some embodiments, the rigid substrate is glass, quartz, sapphire, or a semiconductor, the flexible substrate is plastic, or the rigid substrate is glass, quartz, sapphire, or a semiconductor and the flexible substrate is plastic.

In some embodiments, the micro-devices comprise a first micro-device comprising one or more first material(s) and a second micro-device comprising one or more second material(s) that are different from the one or more first material(s).

In some embodiments, each of the micro-devices comprises at least a portion of a micro-device tether.

In some embodiments, the method comprises micro-transfer printing each micro-device from a native micro-device source wafer to the print adhesive disposed on the rigid substrate, thereby breaking (e.g., fracturing), or separating at least one micro-device tether, wherein, prior to the micro-transfer printing, each of the micro-devices is physically connected to the native micro-device source wafer by the at least one micro-device tether.

In some embodiments, each of the micro-devices is an inorganic micro-light-emitting diode (micro-iLED) and the micro-device substrate is a micro-iLED substrate separate, independent, and distinct from the rigid substrate, from the flexible substrate, and from any other micro-iLED substrate.

In some embodiments, each of the micro-devices comprises one or more micro-elements disposed on the micro-device substrate and each of the one or more micro-elements comprises a micro-element substrate separate, independent, and distinct from the rigid substrate, from the flexible substrate, from the micro-device substrate, and from any other micro-element substrate.

In some embodiments, each micro-element of the one or more micro-elements comprises at least a portion of a micro-element tether.

In some embodiments, the method comprises micro-transfer printing each of the one or more micro-elements from a native micro-element source wafer to the micro-device substrate, thereby breaking or separating at least one micro-element tether, wherein, prior to the micro-transfer printing, each of the one or more micro-elements is physically connected to the native micro-element source wafer by the at least one micro-element tether.

In some embodiments, each micro-device is physically connected to a native micro-device source wafer with at least one micro-device tether, and the method comprises micro-transfer printing each micro-device from the native micro-device source wafer to the print adhesive, thereby breaking or separating the at least one micro-device tether.

In some embodiments, the micro-devices are pixels and one or more of the one or more micro-elements are inorganic micro-light-emitting diodes (micro-iLEDs), and for each of the one or more micro-elements that is an inorganic micro-iLED, the micro-element substrate is a micro-iLED substrate separate, independent, and distinct from the rigid substrate, from the flexible substrate, from the pixel substrate, and from any other micro-iLED substrate.

In some embodiments, each of the micro-devices comprises a micro-controller and the method comprises micro-transfer printing the micro-controller from a native micro-controller source wafer to the micro-device substrate of the micro-device, thereby breaking at least one micro-controller tether or separating at least one micro-controller tether, wherein, prior to the micro-transfer printing the micro-controller is physically connected to a native micro-controller source wafer with the at least one micro-controller tether and the micro-controller comprises a micro-controller substrate separate, independent, and distinct from the rigid substrate, from the flexible substrate, from the micro-device substrate, from any micro-iLED substrate, and from any other micro-controller substrate.

In some embodiments of the present invention, the one or more micro-elements comprises a first micro-element comprising one or more first material(s) and a second micro-element comprising one or more second material(s) that are different from the one or more first material(s).

In some embodiments, the method comprises disposing electrical conductors on the flexible substrate.

In some embodiments of the present invention, each of the micro-devices comprises one or more connection posts electrically connected to a micro-device circuit and the method comprises electrically connecting each connection post to an electrical conductor by micro-transfer printing and bonding the micro-devices to the flexible substrate.

In some embodiments, the micro-devices each comprise electrical contacts electrically connected to the micro-device circuits and the method comprises electrically connecting the electrical contacts of each of the micro-devices to the electrical conductors on the flexible substrate.

In some embodiments, the method comprises forming vias through the bonding layer and forming at least one electrical connection through the vias.

In some embodiments, the micro-devices each comprise micro-device contact pads and the method comprises disposing electrical conductors on the bonding layer and electrically connecting the electrical conductors to the micro-device contact pads.

In some embodiments, a device structure comprises a rigid substrate, a layer of print adhesive disposed on the rigid substrate, micro-devices disposed on or in the print adhesive, wherein each micro-device comprises a micro-device substrate separate, independent, and distinct from the rigid substrate and at least a portion of a micro-device tether, a bonding layer, and a flexible substrate bonded to the micro-devices, wherein (i) the bonding layer is disposed between the flexible substrate and the micro-devices and (ii) the micro-devices are disposed between the rigid substrate and the flexible substrate, and (iii) the micro-device substrate of each of the micro-devices is separate, independent, and distinct from the flexible substrate.

In some embodiments, one or more micro-elements are disposed on the micro-device substrate of each of the micro-devices. Each of the one or more micro-elements comprises a micro-element substrate separate, independent, and distinct from the rigid substrate, from the flexible substrate, from the micro-device substrate, and from any other micro-element substrate, wherein the one or more micro-elements each comprise at least a portion of a micro-element tether.

In some embodiments of the present invention, a flexible device comprises a flexible substrate, a bonding layer, micro-devices bonded to the flexible substrate with the bonding layer, wherein each micro-device comprises a micro-device substrate separate, independent, and distinct from the flexible substrate and comprises at least a portion of a micro-device tether. The micro-devices are exposed to the environment.

Embodiments of the present invention provide flexible devices and structures that are more suitable for micro-transfer printing, have improved location precision for micro-devices, a wider variety of micro-device structures, materials, and functions, and a wider variety of flexible device materials.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIGS. 1-5, 6A-6D, and 7-9 are flow diagrams of construction methods, according to illustrative embodiments of the present invention;

FIGS. 10A-10G are successive cross sections for constructing a flexible device, according to illustrative embodiments of the present invention;

FIGS. 11A-11C are successive cross sections of a micro-transfer source substrate, according to illustrative embodiments of the present invention;

Figure 1:
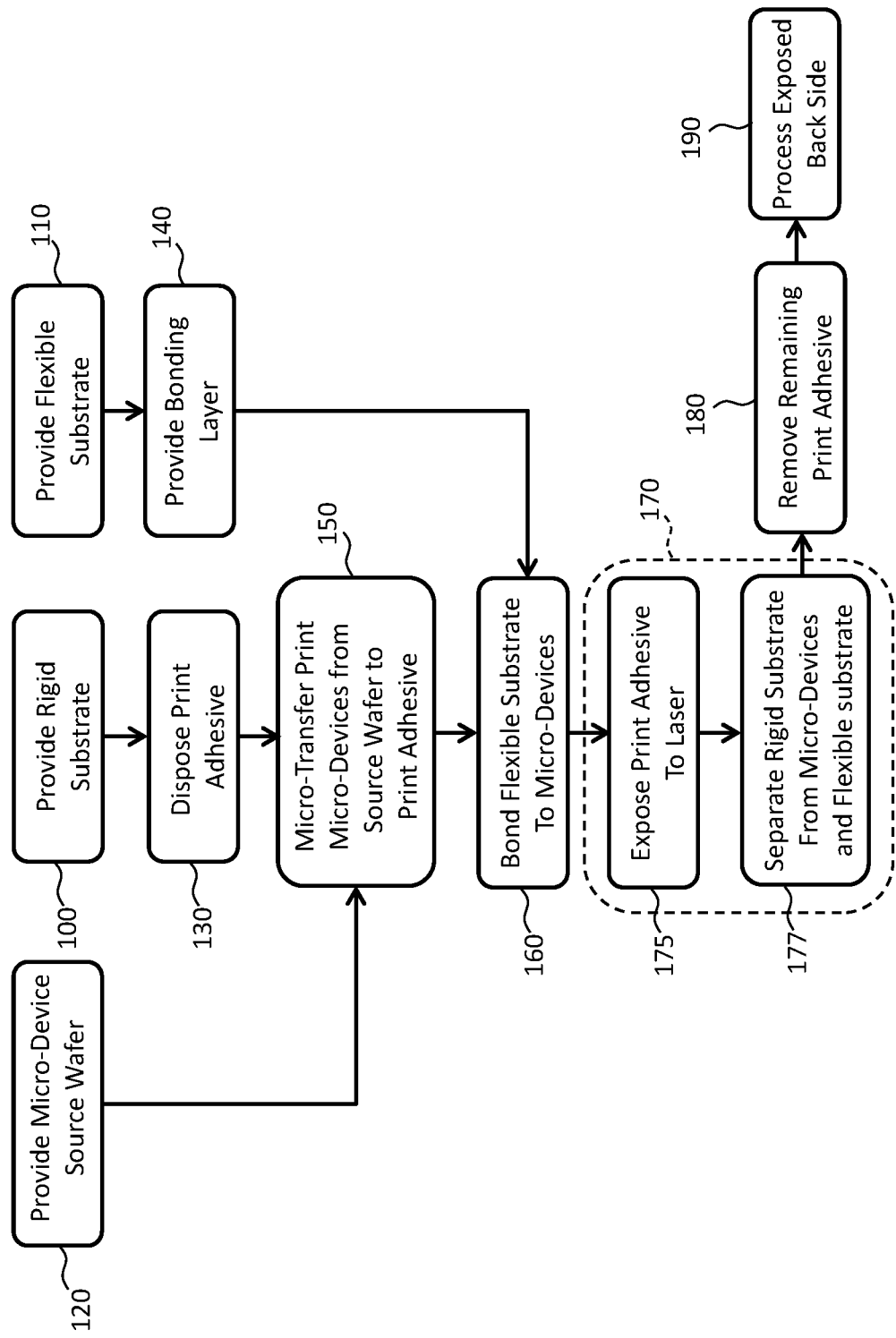

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION

The present invention provides, inter alia, structures, materials, and methods for constructing flexible devices with increased resolution and accuracy and comprising a wider variety of materials, devices, and structures. The flexible devices can comprise micro-devices, such as micro-devices that are transferred from a source substrate or native source wafer using transfer printing, for example micro-transfer printing. The micro-devices can be relatively rigid compared to the relatively flexible device and can themselves comprise one or more transfer printed micro-elements. The micro-devices and micro-elements can comprise different micro-devices and micro-elements having a variety of materials and functions.

Figure 10A:

According to some embodiments of the present invention, and as illustrated in the flow diagram of FIG. 1 and the successive cross sections of FIGS. 10A-10G, a method of making a flexible device 99 (e.g., as shown in FIG. 10G) comprises providing a rigid substrate 10 in step 100 (e.g., as shown in FIG. 10A). A rigid substrate 10 can be, for example a glass, ceramic, metal, sapphire, quartz, fused quartz, or semiconductor substrate having a substantially planar surface, for example as found in the display or photolithographic industries. A rigid substrate 10 can have a thickness greater than or equal to 50 microns, 100 microns, 250 microns, 500 microns, 700 microns, 1000 microns, or greater and can be substantially transparent to one or more electromagnetic radiation frequencies of interest, as discussed further below, for example the emission of a UV laser at about 248 nm, about 266 nm, or about 308 nm.

Figure 10B:
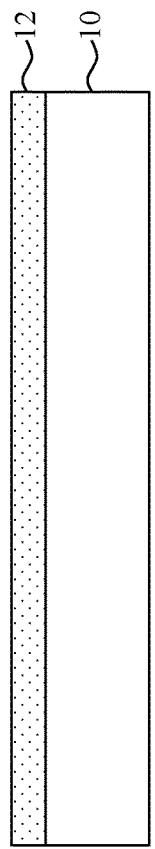

A layer of print adhesive 12 is disposed on a rigid substrate 10 in step 130 as shown in FIG. 10B. A layer of print adhesive 12 can be coated, for example by spray coating, spin coating, slot coating, or any suitable coating method, or by lamination or any other suitable method of providing a layer of adhesive. A print adhesive 12 can be any suitable adhesive, for example a curable (e.g., by heat or radiation) or a non-curable adhesive on and to which devices can be transfer printed, for example micro-transfer printed. A layer of print adhesive 12 can be relatively thin compared to the thickness of the rigid substrate 10, for example having a thickness less than or equal to 100 nm, 500 nm, one micron, two microns, five microns, ten microns, or twenty microns. Print adhesive 12 can be an organic adhesive or an inorganic adhesive and can comprise a light-absorbing material, for example an additive that is selected to preferentially absorb a desired frequency of electromagnetic radiation, for example corresponding to the emission of a laser, such as a UV laser emitting at about 248 nm, about 266 nm, or about 308 nm. In some embodiments of the present invention, a print adhesive is an epoxy material such as SU-8 or LOR10B from Microchem disposed over a rigid substrate 10 comprising glass or quartz such as fused quartz, for example spin-coated at a thickness of 1.3 microns over the rigid substrate 10.

Figure 10C:
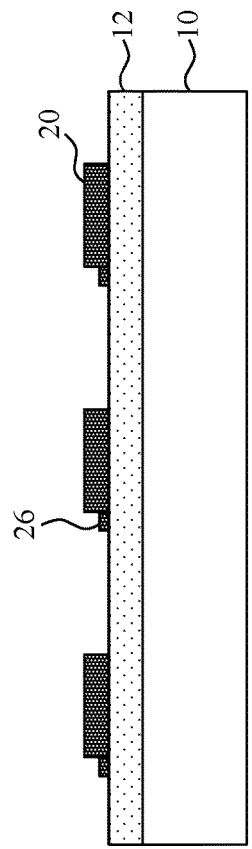

In step 120, a micro-device source wafer or substrate 21 comprising a plurality of micro-devices 20 (one of which is shown on a micro-device source wafer 21 in FIG. 11C and discussed below) is provided and in step 150 micro-devices 20 are micro-transfer printed from a micro-device source wafer 21 to a layer of print adhesive 12, for example by contacting a stamp comprising a plurality of posts having spatial positions corresponding to spatial positions of micro-devices 20 on a micro-device source wafer 21 to the micro-devices 20. The micro-devices 20 adhere to the stamp posts and the stamp is removed from the micro-device source wafer 21, thereby breaking (e.g., fracturing) or separating at least one micro-device tether 28 physically connecting each micro-device 20 to at least one anchor 60 of a micro-device source wafer 21. In some embodiments, each micro-device 20 on a micro-device source wafer 21 is physically connected by more than one micro-device tether 28 to a micro-device source wafer 21 (e.g., to one or more than one anchor 60). The stamp and micro-devices 20 are conveyed to a layer of print adhesive 12 on a rigid substrate 10, and micro-devices 20 are contacted to the layer of print adhesive 12 by the stamp to adhere micro-devices 20 to the layer of print adhesive 12, and then the stamp is removed, providing micro-transfer devices 20 on a layer of print adhesive 12 on a rigid substrate 10 as shown in FIG. 10C. Thus, in certain embodiments, each micro-device 20 comprises a micro-device substrate 22 separate, independent, and distinct from the rigid substrate 10. A plurality of micro-devices 20 can be disposed in an array over an extent of a rigid substrate 10 and can comprise any one or a combination of a large variety of functional devices, for example integrated circuits or light-emitting diodes, lasers, piezo-electric devices, photovoltaic devices, sensor, filters, photodiodes, or other micro-electronic or opto-electronic devices.

Figure 10D:
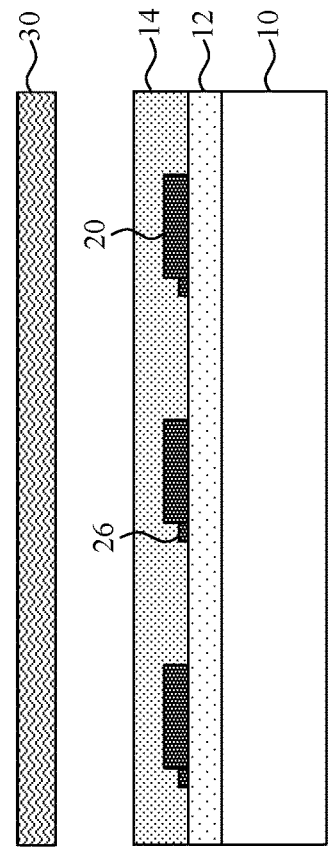

In step 110 and as shown in FIG. 10D, a flexible substrate 30 is provided. A flexible substrate 30 is a flexible substrate that is separate, independent, and distinct from a rigid substrate 10 and from micro-devices 20. A flexible substrate 30 can be, for example, a glass substrate that is relatively thin compared to a rigid substrate 10 (e.g., no more than half as thick). A flexible substrate 30 is flexible and can be, for example, a plastic substrate, a polymer substrate, a resin substrate, or any suitable flexible substrate material. Exemplary flexible substrates 30 can be found in the display or photolithographic industries and can have an extent or area similar to a rigid substrate 10 or to an area over which micro-devices 20 are disposed over a rigid substrate 10. A flexible substrate 30 can have a thickness less than the thickness of a rigid substrate 10, for example about 120 microns or having a thickness less than or equal to 20 microns, 50 microns, 100 microns, 250 microns, or 500 microns. Flexible substrate 30 can be substantially transparent to electromagnetic radiation frequencies of interest, for example substantially transparent to visible light, for example at least 50%, at least 70%, at least 80%, at least 90%, or at least 95% transparent to visible light.

Figure 2:
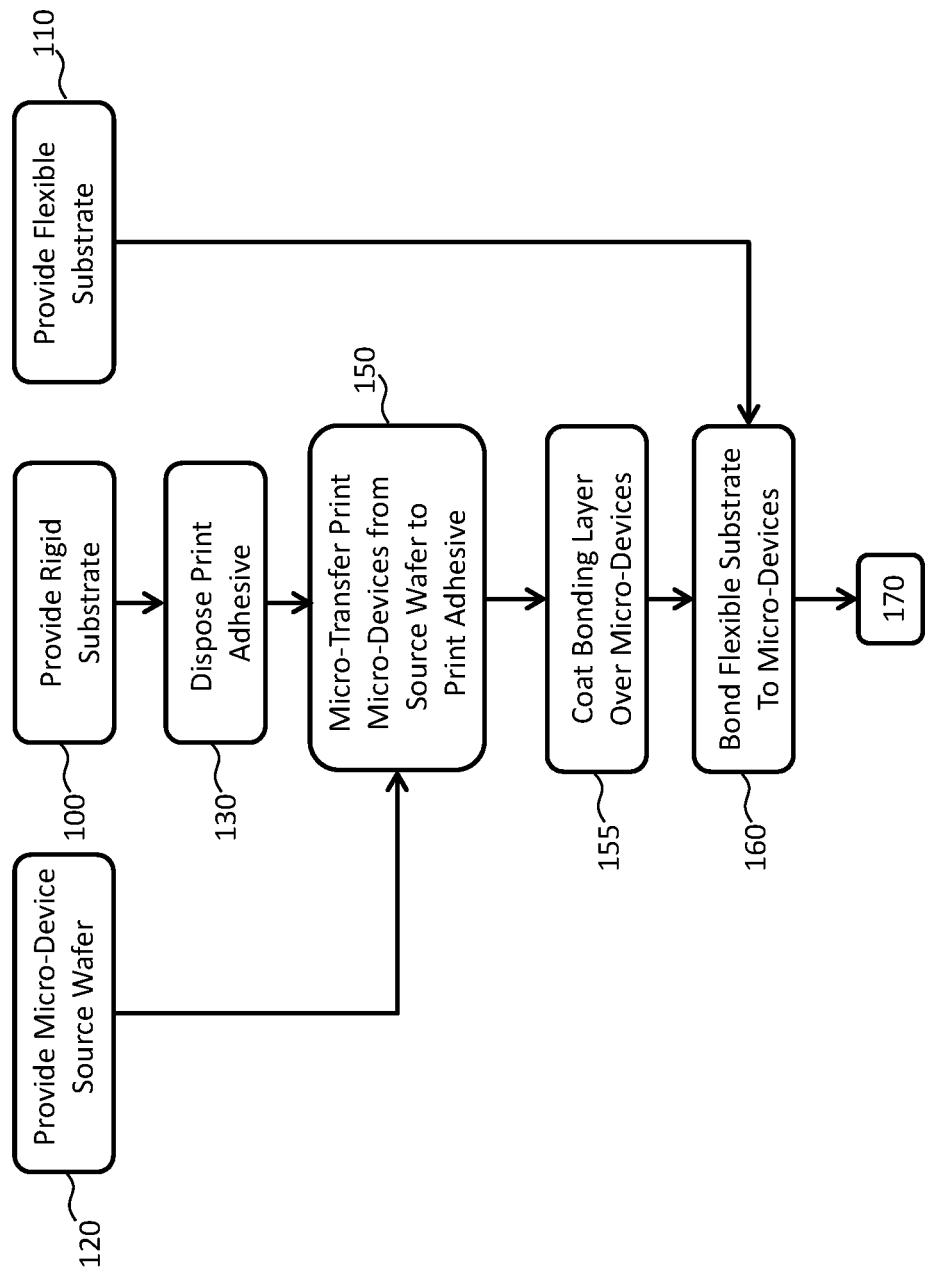
Figure 3:
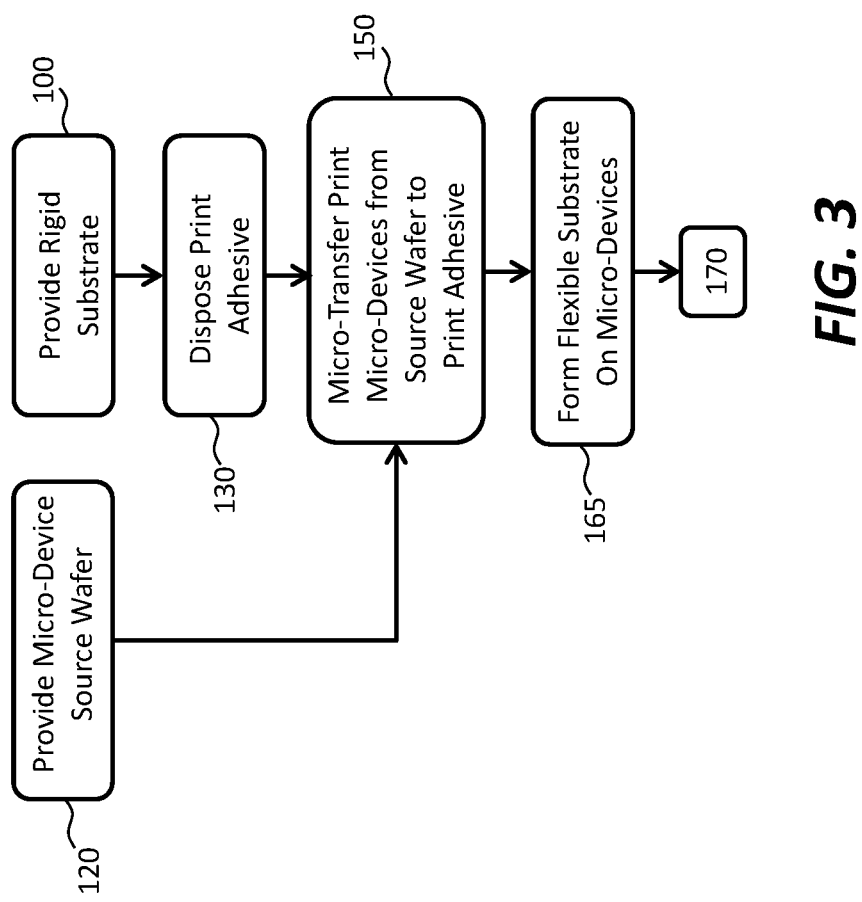

A bonding layer 14 is provided and disposed between a flexible substrate 30 and micro-devices 20 in step 140 of FIG. 1 (also shown in FIG. 10D), for example on a side of a flexible substrate 30 adjacent to micro-devices 20 (not shown in FIG. 10D) or on a side of micro-devices 20 opposite a rigid substrate 10 (as shown in FIG. 10D), and a flexible substrate 30 is bonded to micro-devices 20 in step 160 with a bonding layer 14 such that (i) the bonding layer 14 is disposed between flexible substrate 30 and the micro-devices 20 and (ii) the micro-devices 20 are disposed between the rigid substrate 10 and the flexible substrate 30 (shown in FIG. 10E). A bonding layer 14 can be a layer of adhesive or other bonding agent. In some embodiments of the present invention, a bonding layer 14 can be coated or otherwise disposed on a side of flexible substrate 30 (as shown in step 140 of FIG. 1) or provided with flexible substrate 30 in a single laminated structure. In some embodiments, a bonding layer 14 can be coated or otherwise disposed on micro-devices 20 and, optionally, on some portions of print adhesive 12, as shown in step 155 of FIG. 2. Referring to FIG. 3, in some embodiments, flexible substrate 30 is provided by forming it directly on micro-devices 20 and over a print adhesive 12 in step 165, for example by coating a polymer or plastic flexible layer. In some such embodiments, a flexible substrate 30 is also a bonding layer 14 or comprises a sub-layer that is a bonding layer 14, since the flexible substrate 30 is directly bonded to micro-devices 20.

Thus, according to some embodiments of the present invention, a flexible device 99 comprises a flexible substrate 30, a bonding layer 14, and micro-devices 20 bonded to flexible substrate 30 with bonding layer 14 (as shown in FIG. 10E). Each micro-device 20 comprises a micro-device substrate 22 separate, independent, and distinct from flexible substrate 30 and can comprise at least a portion of a micro-device tether 28. In some embodiments, each micro-device 20 comprises at least a portion of a plurality of micro-device tethers 28.

A bonding layer 14 can be any suitable adhesive, for example a curable (e.g., by heat or radiation) or a non-curable adhesive and can be coated by spin coating, slot coating, syringe coating, lamination or other suitable coating methods. A suitable coating method can depend, for example, on surface characteristics of flexible substrate 30 or micro-devices 20. In some embodiments, a suitable bonding layer 14 comprises Permabond UV360. Adhesion of a flexible substrate 30 to micro-devices 20 and print adhesive 12 with a bonding layer 14 can proceed from a point or line at a central location on a surface of flexible substrate 30 or array of micro-devices 20 and proceed to an edge of flexible substrate 30 or array of micro-devices 20, for example by rolling over the surface of the flexible substrate 30 with a roller from the central location to the edge, to eliminate bubbles in the bonding layer 14. Ensuring that bubbles are removed from a bonding layer 14 can assist further processing steps on a surface of bonding layer 14 as discussed in more detail below. A bonding layer 14 can be an organic adhesive or an inorganic adhesive and can be relatively thin compared to the thickness of a rigid substrate 10 or a flexible substrate 30 and can be at least as thick as any of micro-devices 20.

As shown in FIG. 1 and referring next to FIGS. 10F and 10G, in step 170 a flexible substrate 30, micro-devices 20, and a bonding layer 14 are separated from a rigid substrate 10 leaving micro-devices 20 bonded to flexible substrate 30. This separation step 170 can be performed in a variety of ways (in various embodiments), for example by grinding or etching the rigid substrate 10, or by dissolving print adhesive 12 with heat or exposure to any of a variety of materials, such as liquids or gases. In some embodiments, referring to FIG. 10F, in step 175 print adhesive 12 is exposed to electromagnetic radiation 40 and heated so that the rigid substrate 10 is dissociated from the micro-devices 20 and from the bonded flexible substrate 30. In step 177 and as shown in FIG. 10G, the rigid substrate 10 is separated from the micro-devices 20 and the flexible substrate 30, for example by peeling, leaving the micro-devices 20 bonded to the flexible substrate 30 and the rigid substrate 10 separated from the flexible device 99. Electromagnetic radiation 40 can be provided, for example, by a laser either in a single unpatterned exposure, in multiple exposures, in a patterned exposure, or in a patterned exposure that moves temporally over (e.g., is scanned over) the extent of the bonded flexible substrate 30 to dissociate the bonded flexible substrate 30 and micro-devices 20 from the rigid substrate 10. Print adhesive 12 can comprise light-absorbing materials or particles or can be selected to absorb the electromagnetic radiation 40.

Referring again to FIG. 1, in optional step 180 any remaining print adhesive 12 can be removed from flexible device 99 for example by etching or washing with a suitable chemical, thereby exposing a back side 23 of micro-device 20 to the environment. Back side 23 is, for example, the opposite side of micro-devices 20 contacted by a stamp post during micro-transfer printing. Thus, back side 23 of micro-devices 20 (and bonding layer 14) can be exposed to the environment and are not covered with any other layer in the flexible device 99 structure so that back side 23 of micro-devices 20 and bonding layer 14 can be processed, for example with photolithographic processes and materials compatible with the micro-devices 20, bonding layer 14, and flexible substrate 30, to provide desired additional useful structures on the exposed back side 23 of micro-devices 20 and bonding layer 14, for example providing active or passive electrical or optical structures, in step 190, such as patterned wires that electrically interconnect micro-devices 20.

According to some embodiments of the present invention, micro-devices 20 can be a single structure or element comprising a single material or single set of materials. In some embodiments, a plurality of micro-devices 20 comprises a variety of different materials and the different micro-devices 20 can, for example, have any combination of different structures, sizes, and functions. Thus, in some embodiments, a first micro-device 20 comprises one or more first material(s) and a second micro-device 20 comprises one or more second material(s) that are different from the one or more first material(s).

Figure 4:
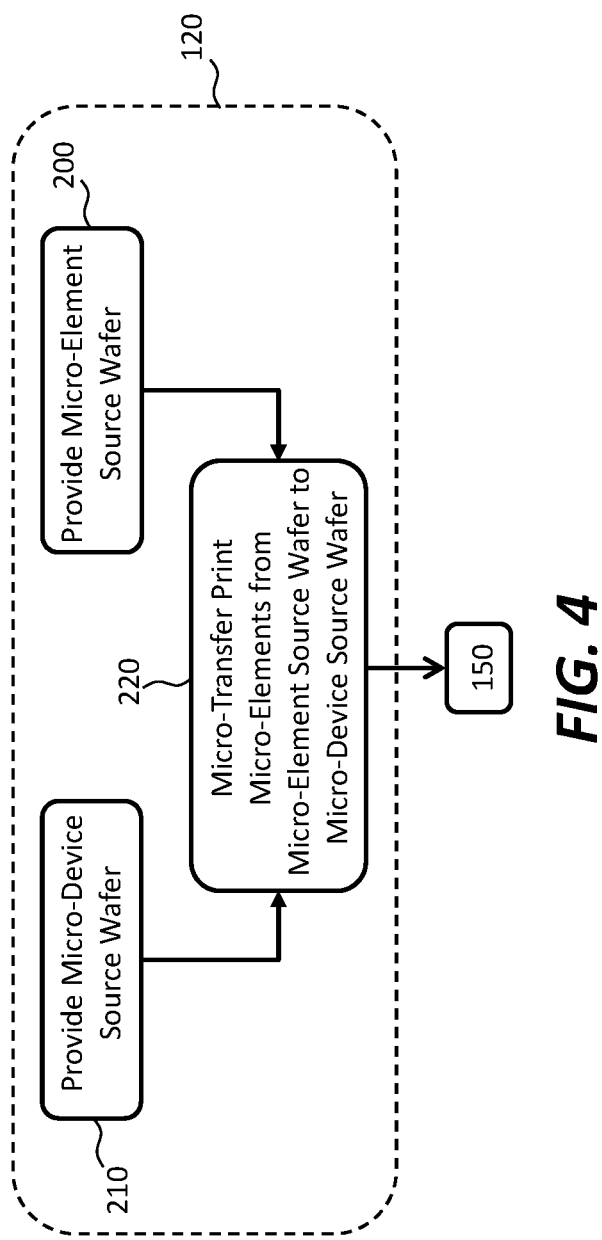
Figure 11C:
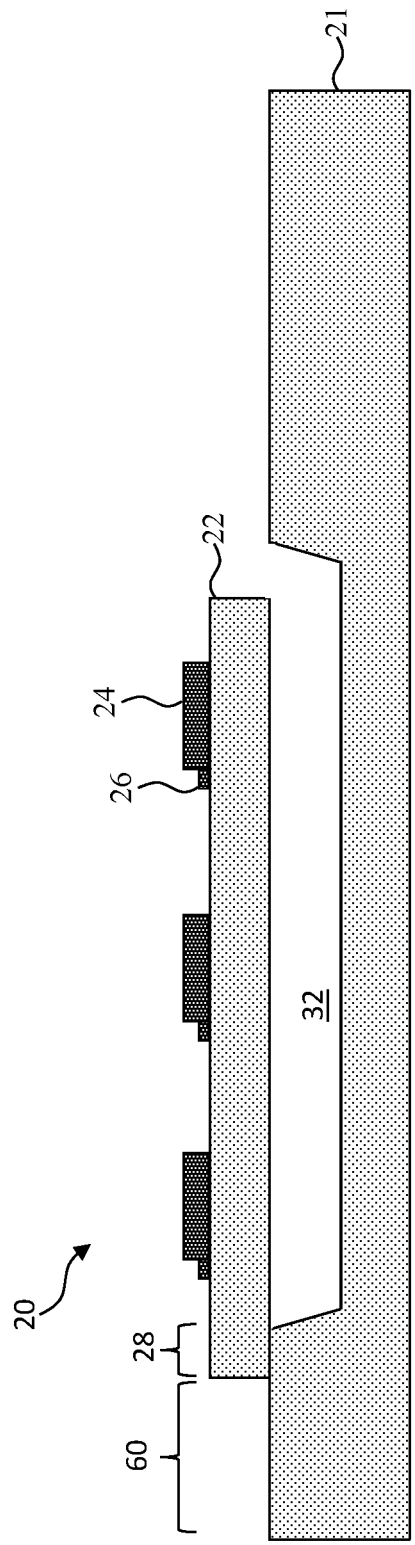

According to some embodiments of the present invention, micro-devices 20 each comprise a single device, structure, or integrated circuit. In some embodiments, however, and referring to the flow diagram of FIG. 4 and the successive cross sections of FIGS. 11A-11D, one or more micro-devices 20 can each comprise one or more micro-elements 24. A native micro-element source wafer (not shown in the Figures) is provided in step 200. The native micro-element source wafer can have a plurality of micro-transfer printable micro-elements 24, for example light-emitting diodes, photosensors, or integrated circuits formed in or on the micro-element source wafer. A micro-device source wafer 21 is provided in step 210. The micro-device source wafer 21 has one or more micro-device substrates 22 formed or disposed on the micro-device source wafer 21 (as shown in FIG. 11A). In step 220 and as shown in FIG. 11B, micro-elements 24 are micro-transfer printed or otherwise transferred from the micro-element source wafer and disposed on each micro-device substrate 22 (e.g., in order to form a compound micro-system). Thus, each micro-element 24 comprises a micro-element substrate separate, independent, and distinct from the rigid substrate 10, from the flexible substrate 30, from the micro-device substrate 22, and from any other micro-element substrate. A micro-device 20 with one or more micro-elements 24 can be further processed on a micro-device source wafer 21, for example photolithographically processed at a high resolution (e.g., thereby forming fine interconnects), to provide structures, such as high-resolution micro-device wires 58 forming electrical connections between micro-elements 24, as shown in the perspective of FIG. 11D.

In some embodiments of the present invention, micro-elements 24 can be different each other within a single micro-device 20 and each micro-element 24 is sourced from a different micro-element source wafer. For example, as shown in FIG. 11D, micro-elements 24 include three different light-emitting diodes 24R, 24G, 24B, each emitting a different color of light, for example red, green, and blue, respectively, and a micro-controller 24C for controlling the red, green, and blue light emitting diodes 24R, 24G, 24B, that are electrically connected with micro-device wires 58, for example with a micro-controller circuit 43. The micro-controller 24C and red, green, and blue light emitting diodes 24R, 24G, 24B are generically referred to as micro-elements 24. Thus, in some embodiments of the present invention, micro-elements 24 can comprise a variety of materials, for example, a plurality of micro-elements 24 can comprise a variety of different materials. Thus, in some embodiments, a first micro-element 24 comprises one or more first material(s) and a second micro-element 24 comprises one or more second material(s) different from the one or more first material(s). Furthermore, native micro-element source wafers for different micro-elements 24 can also comprise different materials, for example comprising different kinds of semiconductor materials, such as silicon, GaN, and GaAs.

Referring to FIG. 11C, micro-elements 24 micro-transfer printed on the micro-device substrate 22 (and processed with any desired photolithographic processing) provide a micro-device source wafer 21 comprising one or more completed micro-devices 20 in step 120 (shown in FIG. 1). Micro-devices 20 on micro-device source wafer 21 can then be applied to print adhesive 12, for example by transfer printing, such as micro-transfer printing, from micro-device source wafer 21 to print adhesive 12. Micro-transfer printing micro-devices 20 from micro-device source wafer 21 can be, in certain embodiments, facilitated by etching a sacrificial portion 32 of micro-device source wafer 21 beneath each micro-device substrate 22, releasing the micro-devices 20 from the micro-device source wafer 21. Each micro-device 20 is maintained in position with respect to micro-device source wafer 21 by at least one micro-device tether 28 physically connecting micro-device 20 to at least one anchor 60 portion of micro-device source wafer 21. Each micro-device tether 28 is broken (e.g., fractured) or separated when the micro-device 20 is contacted with a stamp post for micro-transfer printing the micro-device 20 from micro-device source wafer 21 to print adhesive 12. Similarly, each micro-transfer printed micro-element 24 will have at least one similar broken (e.g., fractured) or separated micro-element tether 26 when micro-transfer printed from a micro-element source wafer to a micro-device substrate 22. Each micro-element 24 is similarly physically connected to a native micro-element source wafer with at least one micro-element tether 26 before it is micro-transfer printed to a micro-device substrate 22 and each micro-element tether 26 is broken (e.g., fractured) or separated (not shown in the Figures).

Figure 11D:
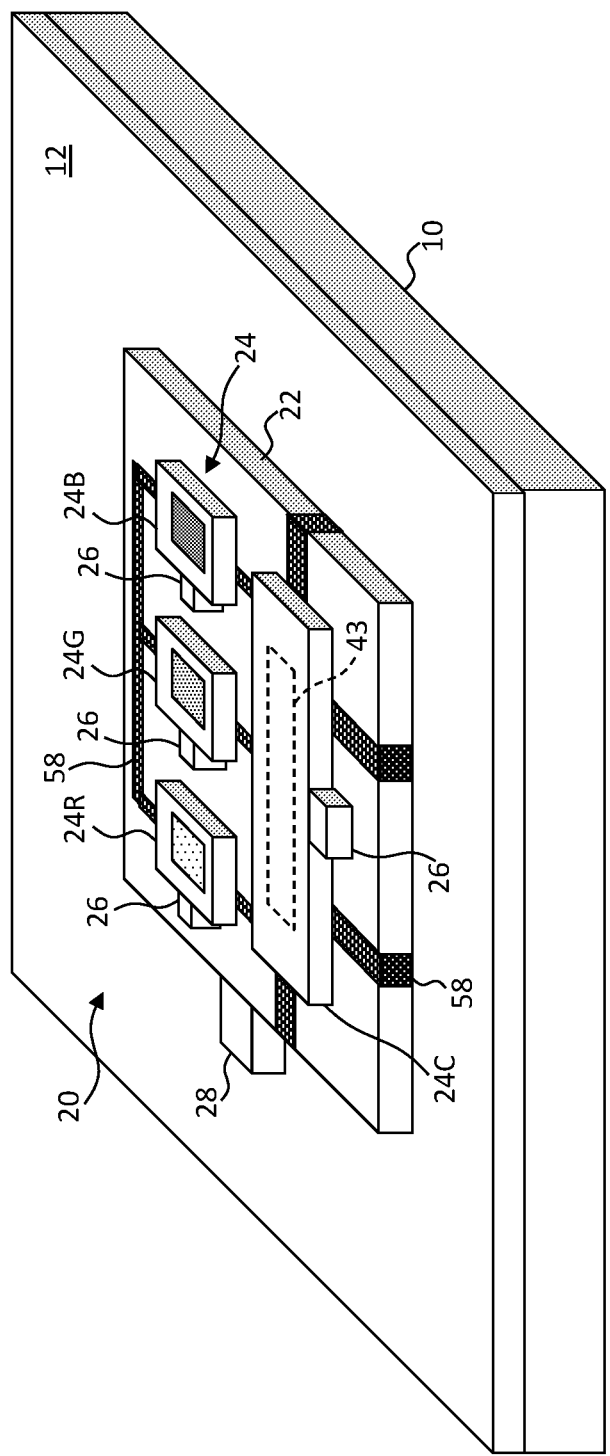
FIG. 11D is a perspective of a structure made using micro-transfer printing subsequent to the structure of FIG. 11C, according to illustrative embodiments of the present invention.

As shown in FIG. 11D, each micro-device 20 comprises a broken (e.g., fractured) or separated micro-device tether 28 and each micro-element 24 comprises a broken (e.g., fractured) or separated micro-element tether 26. Thus, in some embodiments of the present invention, each micro-element 24 comprises at least a portion of a micro-element tether 26 and each micro-device 20 comprises at least a portion of a micro-device tether 28. The tethers can be a part of the corresponding substrate or a layer disposed over the corresponding substrate.

Methods and structures according to some embodiments of the present invention provide or are a display or display system. In some embodiments, micro-devices 20 are pixels, a micro-device substrate 22 is a pixel substrate, and one or more of the one or more micro-elements 24 are inorganic micro-light-emitting diodes (micro-iLEDs). Each inorganic micro-iLED can comprise a micro-iLED substrate separate, independent, and distinct from rigid substrate 10, from flexible substrate 30, from a pixel substrate (micro-device substrate 22), and from any other micro-iLED substrate. Each pixel (micro-device 20) can comprise a micro-controller 24C comprising a micro-controller substrate separate, independent, and distinct from rigid substrate 10, from flexible substrate 30, from micro-device substrate 22, from any micro-iLED substrate, and from any other micro-controller substrate (micro-element substrate). A micro-controller 24C is a micro-element 24. Each micro-controller 24C can be micro-transfer printed from a native micro-controller source wafer (micro-element source wafer) to a micro-device substrate 22, for example, thereby breaking at least one micro-controller tether (micro-element tether 26) or separating at least one micro-controller tether (micro-element tether 26) from the native micro-element source wafer to which the micro-controller was physically connected prior to printing. Thus, a micro-device 20 that is a pixel can comprise multiple, different micro-transfer printed micro-elements 24 electrically connected with micro-device wires 58 on a micro-device substrate 22.

In some embodiments, micro-devices 20 or micro-elements 24 are micro-light-emitting diodes (micro-LEDs) or photo-sensors, for example having light-emissive or light-sensitive areas of less than 10, 20, 50, or 100 square microns. In some embodiments, micro-elements 24 such as micro-LEDs have physical dimensions that are less than 200 µm, less than 150 µm, or less than 100 µm, for example having at least one of a width from 2 to no more than 5 µm, 5 to no more than 10 µm, 10 to no more than 20 µm, or 20 to no more than 50 µm, a length from 2 to no more than 5 µm, 5 to no more than 10 µm, 10 to no more than 20 µm, or 20 to no more than 50 µm, and a height from 2 to no more than 5 µm, 5 to no more than 10 µm, 10 to no more than 20 µm, or 20 to no more than 50 µm. In some embodiments, micro-elements 24 can have a lateral size of one square micron to 500 square microns. Micro-iLED micro-elements 24 have the advantage of a small light-emissive or light-sensitive area compared to their brightness or sensitivity. Moreover, inorganic micro-light-emitting diodes can provide excellent color purity, highly saturated colors, and a substantially Lambertian emission providing a wide viewing angle.

In some embodiments in which micro-devices 20 or micro-elements 24 are light emitters such as light-emitting diodes, the light-emitting diodes can emit light through flexible substrate 30 or in a direction opposite from flexible substrate 30. In some embodiments, light emitters emit light (e.g., a portion or substantially all of light that is emitted) in a direction opposite from flexible substrate 30, which is then reflected back through the flexible substrate 30. In some embodiments, light-emitting diodes can emit light through a micro-device substrate 22 or in a direction opposite from a micro-device substrate 22.

Figure 5:
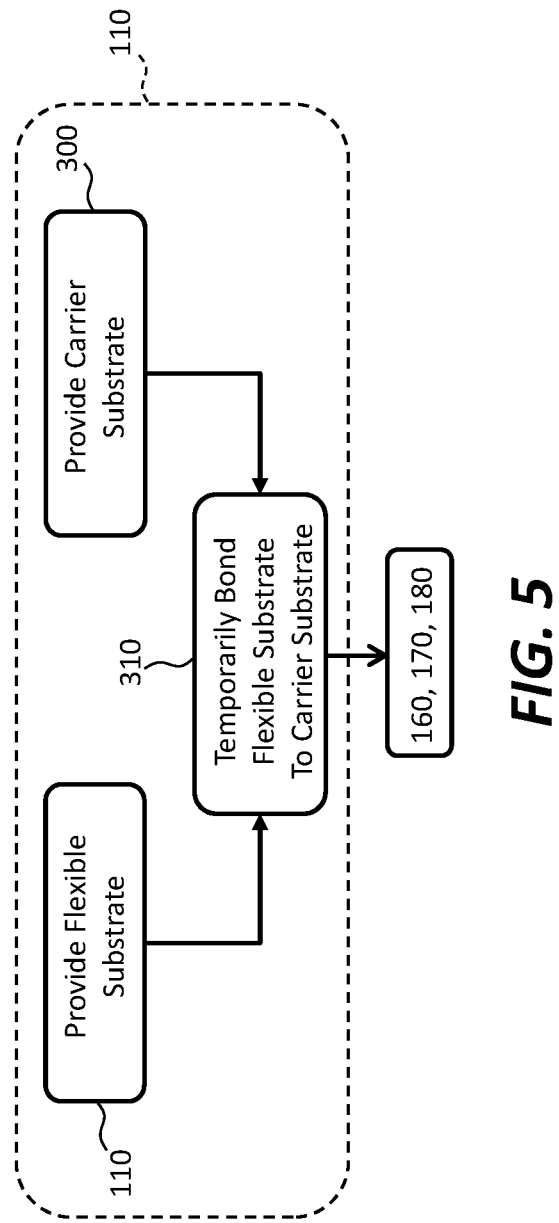
Figure 13:
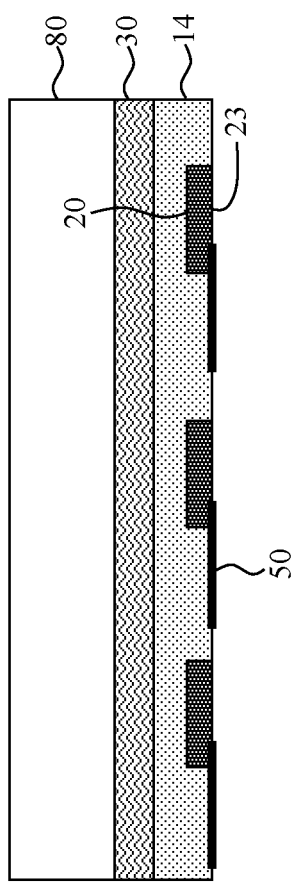
FIG. 13 is a cross section of a structure comprising a carrier substrate and micro-devices electrically connected with wires on a bonding layer, according to illustrative embodiments of the present invention.

Referring to the cross section of FIG. 13 and the flow diagram of FIG. 5, in some embodiments of the present invention, a carrier substrate 80 is provided in step 300 and temporarily adhered to a flexible substrate 30 in step 310 on a side of the flexible substrate 30 opposite bonding layer 14 and micro-devices 20. A carrier substrate 80 can be a rigid substrate provided to control the mechanical attributes of flexible substrate 30 during processing, for example to provide increased rigidity and thermal stability during photolithographic processing. A carrier substrate 80 can comprise similar or the same materials as a rigid substrate 10, for example glass.

A carrier substrate 80 can be adhered (step 310) to flexible substrate 30 at a variety of different times according to various embodiments of the present invention. In some embodiments, a carrier substrate 80 is temporarily adhered to a flexible substrate 30 in step 310 before the flexible substrate 30 is bonded to micro-devices 20 in step 160. In some embodiments, a carrier substrate 80 is temporarily adhered to a flexible substrate 30 in step 310 before a rigid substrate 10 is separated from micro-devices 20 and flexible substrate 30 in step 170. In some embodiments, a carrier substrate 80 is temporarily adhered to a flexible substrate 30 in step 310 before print adhesive 12 is exposed to electromagnetic radiation 40 from a laser in step 175 or rigid substrate 10 is separated from micro-devices 20 and flexible substrate 30 in step 177. In some embodiments, a carrier substrate 80 is temporarily adhered to a flexible substrate 30 in step 310 after a rigid substrate 10 is separated in step 170 and before any subsequent processing in step 190, for example to form electrical connections on the back side 23. In some embodiments, a carrier substrate 80 is temporarily adhered to a flexible substrate 30 in step 310 after remaining print adhesive 12 is removed in step 180 and before any subsequent processing in step 190, for example to form electrical connections on the back side 23.

Just as a carrier substrate 80 can be temporarily adhered to flexible substrate 30 at various times, the carrier substrate 80 can be separated from a flexible substrate 30 at various times. Referring to FIG. 6A, in some embodiments of the present invention, a carrier substrate 80 is separated from a flexible substrate 30 in step 320 after bonding the flexible substrate 30 to micro-devices 20 in step 160 and before removing a rigid substrate 10 in step 170 so as to protect the flexible substrate 30 and the micro-devices 20 during the bonding process (step 140 or 155). Referring to FIG. 6B, in some embodiments of the present invention, a carrier substrate 80 can be separated from a flexible substrate 30 in step 320 after step 170 and before step 180 so as to protect the flexible substrate 30 and micro-devices 20 during the separation process for a rigid substrate 10 (step 170, 175 or 177). Referring to FIG. 6C, in some embodiments of the present invention, a carrier substrate 80 can be separated from a flexible substrate 30 in step 320 after step 180 and before step 190 so as to protect the flexible substrate 30 and micro-devices 20 during the removal process for print adhesive 12 (step 180). Referring to FIG. 6D, in some embodiments of the present invention, a carrier substrate 80 can be separated from a flexible substrate 30 in step 320 after step 190 so as to protect the flexible substrate 30 and micro-devices 20 during back side processing steps (step 190).

Figure 12A:
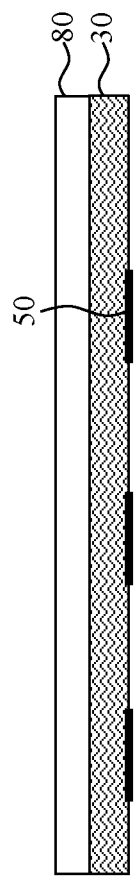
FIGS. 12A-12D are successive cross sections for constructing a flexible device having electrically connected micro-devices, according to illustrative embodiments of the present invention.
Figure 12B:
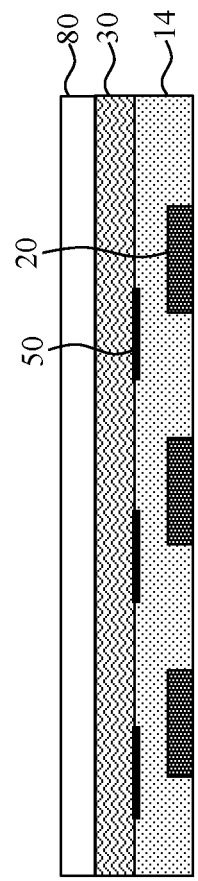

Micro-devices 20 in a flexible device 99 can be electrically connected using a variety methods and in a variety of structures. In some embodiments, as shown in the cross section of FIG. 12A and referring to the flow diagram of FIG. 7, a flexible substrate 30 is provided in step 110 and electrical conductors 50 are disposed on flexible substrate 30 in step 330, for example using photolithographic materials and methods and optionally with a rigid carrier substrate 80 temporarily adhered to a side of the flexible substrate 30 opposite the electrical conductors 50 to provide stability during processing. Electrical conductors 50 can be, for example, patterned metal wires or patterned conductive oxides or polymers, and can be conductive traces disposed over a substrate, for example a display substrate, and can comprise electrical contact pads, wire-bond pads, or connector pads for electrically connecting to active or passive electrical devices. Referring next to FIG. 12B, a flexible substrate 30 is bonded with a bonding layer 14 to micro-devices 20 in step 160 and a rigid substrate 10 separated in step 170 (e.g., corresponding to the structure of FIG. 10G with the addition of the electrical conductors 50 on the flexible substrate 30 and optional carrier substrate 80) and, optionally, any remaining print adhesive 12 is removed in step 180.

Figure 8:
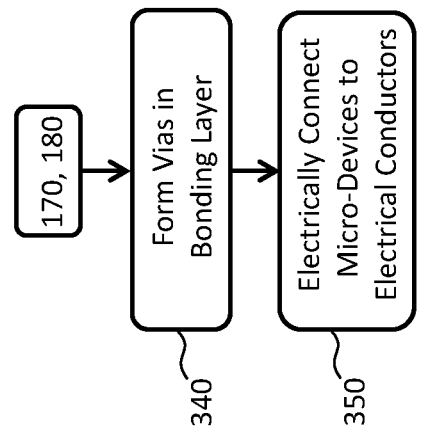
Figure 12C:
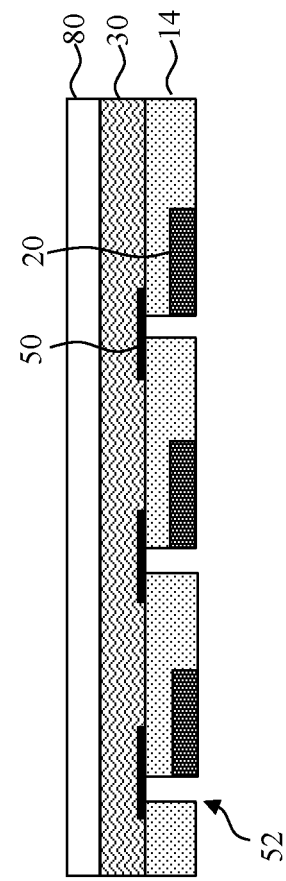
Figure 12D:
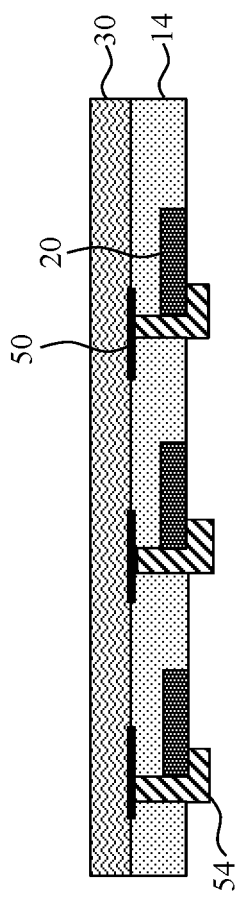

Referring to the flow diagram of FIG. 8 and the cross section of FIG. 12C, vias 52 are formed in a bonding layer 14 in step 340 to expose at least a portion of electrical conductors 50, for example using a patterned etch step such as those found in the photolithographic arts. Once vias 52 are formed through the bonding layer 14 to the electrical conductors 50, the vias 52 can be filled with a patterned electrical conductor in step 350 and as shown in FIG. 12D to form an electrical connection 54 that electrically connects electrical conductors 50 on a flexible substrate 30 to bonded micro-devices 20. The steps 340 and 350 can be an exposed back side process step 190.

Figure 7:
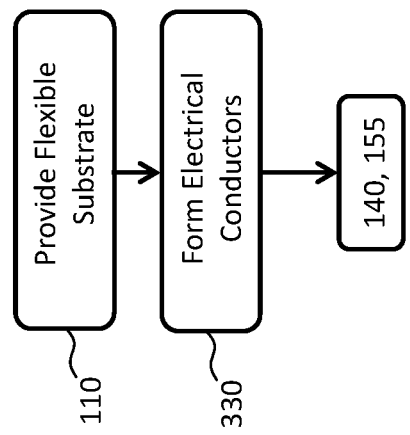
Figure 9:
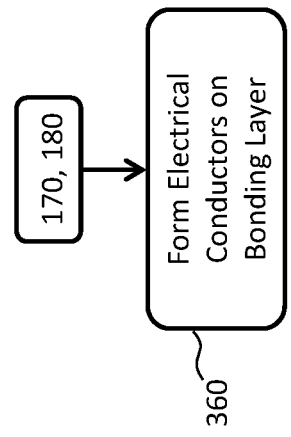

The methods of FIGS. 7 and 8 and the cross sections of FIGS. 12A-12D illustrate electrical connections from micro-devices 20 to electrical conductors 50 disposed and patterned on a flexible substrate 30. In some embodiments, electrical conductors 50 are disposed, formed, or provided on a bonding layer 14 to electrically connect micro-devices 20 in step 360 (shown in the flow diagram of FIG. 9 and the cross section of FIG. 13). Electrical conductors 50 can be photolithographically disposed or formed over or on a bonding layer 14 and also in contact with or over portions of micro-devices 20, for example micro-device contact pads 420 (illustrated in FIG. 14) provided as part of micro-devices 20. Electrical conductors 50 can be formed with exposed back side 23 processing in a single structure or with additional structures, for example by providing patterned insulating dielectric structures (not shown) in combination with patterned electrical conductors 50.

Figure 14:
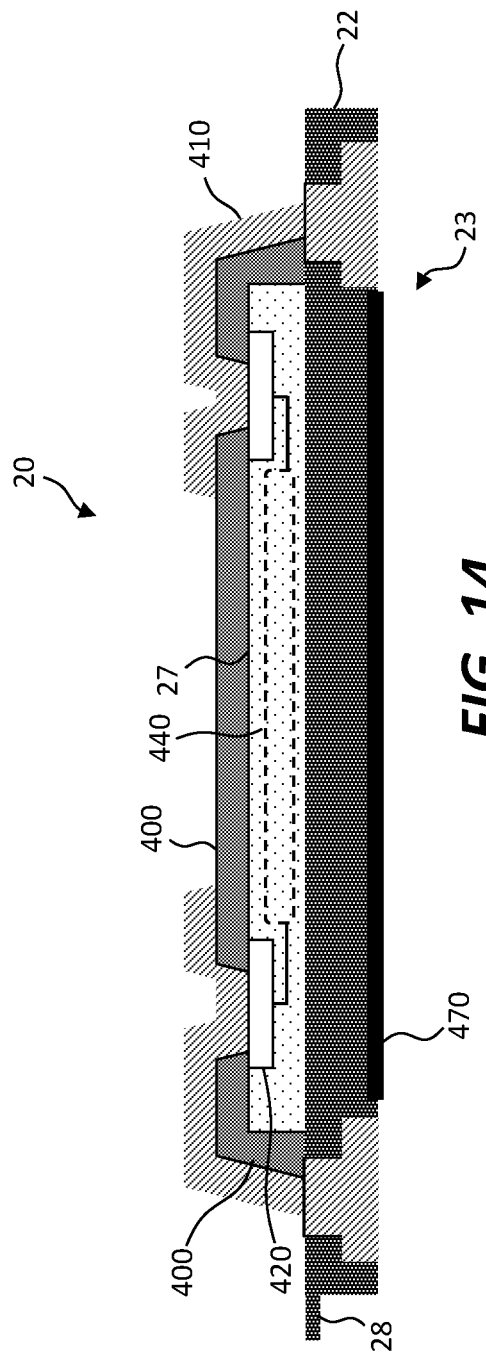
FIG. 14 is a cross section of a micro-device comprising electrodes, according to illustrative embodiments of the present invention.

FIG. 14 illustrates a micro-device 20 having electrodes 410 electrically accessible from the back side 23 and useful, for example, in the structure of FIG. 13. FIG. 14 illustrates a cross section of a micro-device 20 having a micro-device substrate 22 on which a semiconductor device or integrated circuit 27 having a micro-device circuit 440 electrically connected to micro-device contact pads 420 is disposed. Micro-device contact pads 420 are electrically connected to electrodes 410 through a patterned dielectric structure 400 and through the micro-device substrate 22 to the back side 23.

Patterned electrical conductors 50 can be formed at a lower, coarser resolution than a relatively higher resolution of wires (e.g., fine interconnections) provided in micro-devices 20 (e.g., micro-device wires 58 (shown in FIG. 11D)). A flexible substrate 30 can be much larger than individual micro-devices 20 so that maintaining a high resolution for closely spaced narrow wires for a larger flexible substrate 30 is much more difficult and expensive than for much smaller micro-devices 20.

Figure 15:
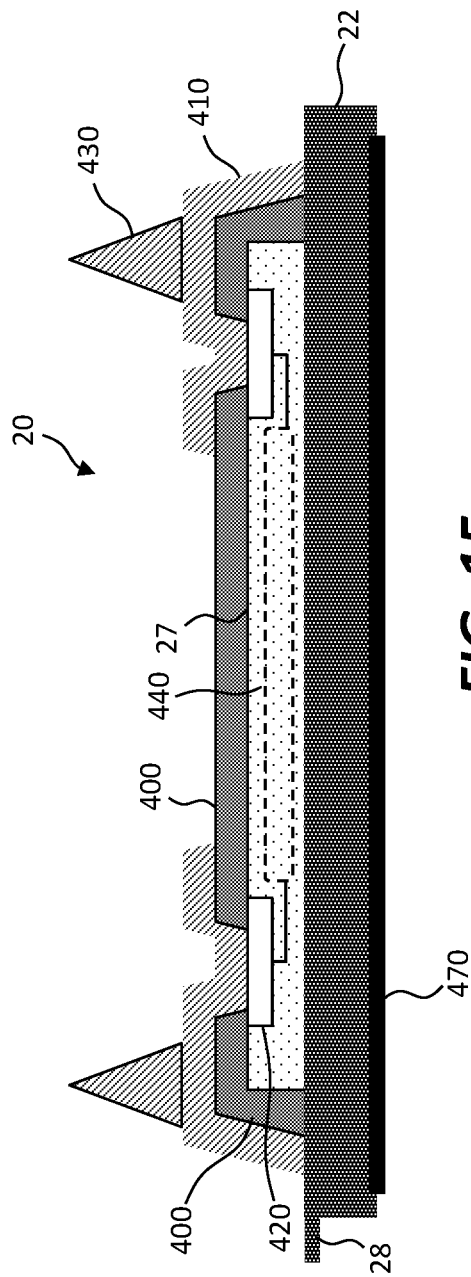
FIG. 15 is a cross section of a micro-device comprising connection posts, according to illustrative embodiments of the present invention.
Figure 16:
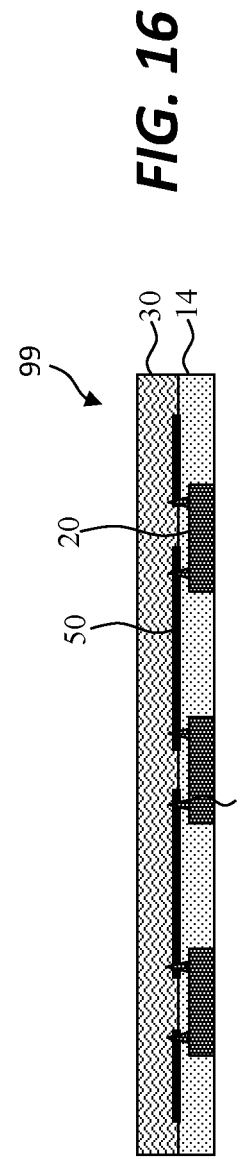
FIG. 16 is a cross section of a flexible device comprising micro-devices with connection posts, according to illustrative embodiments of the present invention.

In some embodiments of the present invention, and as illustrated in the cross sections of FIGS. 15 and 16, a micro-device 20 comprises connection posts 430 electrically connected to a micro-device circuit 440 (for example, a micro-controller circuit 43 illustrated in FIG. 11D) for controlling micro-device 20. In some embodiments, a micro-device 20 comprises connection posts 430 electrically connected to a light-emitting or light-sensing layer or layers, for example, for providing a current across the layer(s) thereby causing them to emit light. Methods according to some embodiments of the present invention comprise electrically connecting each connection post 430 to an electrical conductor 50 by bonding micro-devices 20 to a flexible substrate 30 with a bonding layer 14, for example by pressing the flexible substrate 30 against the micro-device connection posts 430 as part of bonding step 160 so that connection posts 430 are in electrical contact with and contact, pierce, or deform electrical conductors 50 to form an electrical connection between micro-device circuit 440 of micro-device 20 and electrical conductors 50 of flexible substrate 30. Each micro-device 20 can comprise electrical micro-device contact pads 420 electrically connected to micro-device circuits 440 and methods according to some embodiments of the present invention comprise electrically connecting electrical micro-device contact pads 420 to electrical conductors 50 on the flexible substrate 30 through connection posts 430.

FIG. 15 illustrates a cross section of a micro-device 20 comprising a micro-device substrate 22 on which a semiconductor device or integrated circuit 27 comprising a micro-device circuit 440 electrically connected to micro-device contact pads 420 is disposed. Micro-device contact pads 420 are electrically connected to electrodes 410 through a patterned dielectric structure 400. A connection post 430 is formed on each electrode 410 and an optional light shield 470 is disposed on a side of the micro-device 20. A micro-device substrate 22 can be a semiconductor (such as mono-crystalline silicon), silicon dioxide, silicon nitride, glass, ceramic, metal, sapphire, quartz, or other suitable substrate materials. A micro-device substrate 22 can have a thickness of less than or equal to 250 microns, less than or equal to 100 microns, less than or equal to 50 microns, less than or equal to 20 microns, less than or equal to 10 microns, less than or equal to 5 microns, or less than or equal to 2 microns. For example, a micro-device substrate 22 can have a thickness from 2 to no more than 5 microns, from 5 to no more than 10 microns, 10 to no more than 50 microns, 50 to no more than 100 microns, 100 to no more than 200 microns, or 200 to no more than 500 microns.

A semiconductor device 27 can be an integrated circuit formed in, on, or disposed on micro-device substrate 22. In some embodiments, a micro-device 20 comprises multiple semiconductor devices 27 (e.g., micro-elements 24), electrodes 410 extend onto micro-device substrate 22, and connection posts 430 extend from electrodes 410 on micro-device substrate 22. Patterned dielectric structures 400 can comprise silicon dioxide and electrodes 410 can comprise a metal. Light shield 470 can protect micro-devices 20 from exposure to electromagnetic radiation 40, for example from a laser in step 175 (as shown in FIG. 1) and can comprise a patterned reflective layer, for example a patterned metal layer. In some embodiments, materials and structures of micro-device 20 can be deposited and patterned using photolithographic methods and processes.

FIG. 16 illustrates a cross section of a flexible device 99 comprising a plurality of micro-devices 20, each comprising connection posts 430 that extend through bonding layer 14 into electrical conductors 50 on the flexible substrate 30.

In some embodiments of the present invention and as illustrated in FIG. 13, electrical conductors 50 are disposed, for example using patterned metal wires formed by photolithographic methods, materials, and processes, on a bonding layer 14. Micro-devices 20 can each comprise micro-device contact pads 420 (electrical contacts) that are electrically connected to electrical conductors 50, for example with electrodes 410.

Certain embodiments of the present invention provide advantages over methods and structures of the prior art. For example, in a prior-art method, a flexible substrate is temporarily adhered to a rigid carrier to provide a rigid structure suitable for some manufacturing processes, and then separated from the rigid carrier after processing to provide a flexible structure. However, many manufacturing processes are incompatible with flexible substrate materials, for example process temperatures over 120 degrees C. can be problematic for some plastic materials. Furthermore, a surface of a flexible substrate can have characteristics that are less suitable for some manufacturing processes than a surface of a rigid substrate. For example, the coefficient of thermal expansion (CTE) of rigid materials tends to be much smaller than the CTE of flexible materials. For example, the CTE of fused quartz is 0.55 (×10E-6/K) over a range of 20-1000 degrees C. and the CTE of polyethylene terephthalate (PET) is 59.4 (×10E-6/K) so that high-resolution process alignment and precision (for example, within one or two microns) at different temperatures can be difficult to achieve because of the different thermal expansion rates of the different materials. Thus, in certain embodiments, micro-transfer printing on or over a surface of a rigid glass, sapphire, or quartz substrate can provide higher accuracy disposition of micro-devices 20 than micro-transfer printing directly on or over a surface of a plastic material such as PEN or PET.

Other prior-art methods use a flexible carrier substrate adhered to a native wafer having micro-devices, such as a semiconductor wafer, and then the native wafer substrate is removed, for example by grinding or etching, leaving the micro-devices adhered to the flexible carrier substrate. However, this prior-art method limits the micro-devices to those formed and arranged on a single native wafer. In many applications, a greater variety of micro-devices arranged in patterns different from micro-device patterns found on a native source wafer are desired. For example, it can be useful to arrange micro-devices 20 on a flexible substrate 30 with a spacing much greater than the spacing of micro-devices on a native source wafer (e.g., micro-devices 20 on a micro-device source wafer 21 as shown in FIG. 11C) or to use micro-devices 20 comprising different materials that cannot be formed on a single native wafer.

Thus, certain embodiments of the present invention, in which a flexible substrate 30 is applied after at least some process steps are completed or micro-devices 20 disposed, can enable a greater variety of materials, especially flexible substrate materials, a greater variety of micro-devices 20, greater precision in the final disposition of micro-devices 20, and fewer limitations on the arrangement of micro-devices 20 on a flexible substrate 30 (or a combination thereof). Furthermore, because micro-devices 20 can be very small, for example having at least one of a length and a width less than 200 microns, 100 microns, 50 microns, 20 microns, 10 microns, five microns, two microns, or one micron, and are spaced apart on a flexible substrate 30, even if the micro-devices 20 are relatively rigid compared to the flexible substrate 30, a flexible device 99 is still relatively flexible since the great majority of the flexible substrate 30 is between rigid micro-devices 20 and maintains its flexibility even when micro-devices 20 are disposed on the flexible substrate 30. Relatively rigid and small micro-devices 20 incorporating integrated circuits enable the use of monocrystalline semiconductor materials, such as silicon or various compound semiconductors, in the micro-devices 20 for a flexible device 99. Such crystalline integrated circuits have an electron mobility that is orders of magnitude greater than flexible semiconductor materials, such as polythiophene. Thus, certain embodiments of the present invention provide flexible devices 99 that have greater performance, particularly for integrated circuits.

Certain embodiments of the present invention also enable back-side processing of micro-devices 20. Once rigid substrate 10 and any undesired remaining print adhesive 12 are removed, a back side 23 of the micro-devices 20 is exposed to the environment and can be processed, for example using photolithographic processes and materials compatible with the flexible substrate 30 to form active or passive structures, such as electrical conductors electrically connected to or integrated with micro-devices 20.

Methods according to some embodiments of the present invention are useful for constructing flexible devices 99 and device structures, for example flexible display devices. One or more steps of some such methods a device structure 98 (e.g., as shown in FIG. 10E) that comprises a rigid substrate 10, a layer of print adhesive 12 disposed on a rigid substrate 10, and micro-devices 20 disposed on or in the print adhesive 12. Each micro-device 20 comprises a micro-device substrate 22 separate, independent, and distinct from a rigid substrate 10, from a flexible substrate 30, and from a micro-device substrate 22 of any other micro-device 20. Each micro-device 20 can also comprise at least a portion of a micro-device tether 28. A bonding layer 14 bonds a flexible substrate 30 to micro-devices 20. In some embodiments of the present invention, one or more micro-elements 24 are disposed on each micro-device substrate 22. Each micro-element 24 comprises a micro-element substrate separate, independent, and distinct from a rigid substrate 10, from a flexible substrate 30, from a micro-device substrate 22, and from a micro-element substrate of any other micro-element 24. Each micro-element 24 can comprise at least a portion of a micro-element tether 26.

Micro-devices 20 can comprise but are not limited to any combination of electronic, optical, or opto-electronic devices, such as integrated circuits, CMOS circuits, bipolar circuits, sensors, photo-sensors, photo-transistors, piezo devices, optical filters, energy emitters such as electromagnetic radiation emitters, light emitters, or light-emitting diodes. Micro-devices 20 can comprise not only a micro-device substrate 22 material, but also other materials, for example materials in one or more emitting or sensing layers, micro-device contact pads 420 comprising metal, a patterned dielectric structure 400 comprising silicon dioxide, and electrodes 410 comprising a metal. Materials can include, for example, semiconductor materials, compound semiconductor materials, dielectrics, conductors, metals, transparent conductive oxides, silicon dioxide, or silicon nitride, and can include light-absorbing additives such as dyes or pigments or light-emitting additives (e.g., color conversion additives) such as phosphors or quantum dots. Materials can be crystalline, polycrystalline, or amorphous.

Referring to FIG. 1 and FIG. 10F, in step 175, print adhesive 12 is exposed to a desired frequency of electromagnetic radiation 40 through the rigid substrate 10, for example ultra-violet radiation having a wavelength of, for example, about 266 nm or about 248 nm generated by excimer lasers such as KrF pulsed lasers with a pulse width of 25-50 ns and laser fluence of 400-600 mJ/cm$^2$ or more, or other suitable exposure conditions. In certain embodiments, a rigid substrate 10 is more transparent to a desired frequency of electromagnetic radiation 40 than is print adhesive 12, so that electromagnetic radiation 40 preferentially passes through the rigid substrate 10, strikes print adhesive 12, and is at least partially absorbed by the print adhesive 12, thereby heating the print adhesive 12. In step 175, the laser radiation (electromagnetic radiation 40) exposure conditions, rigid substrate 10 transparency, and print adhesive 12 transparency are selected to provide enough energy to print adhesive 12 to disturb atoms of print adhesive 12 and dissociate one or more portions of print adhesive 12 from rigid substrate 10, for example by breaking interatomic or molecular bonds of the atoms at the interface between print adhesive 12 and rigid substrate 10, or by disturbing the structure or materials, or both, at the interface. The disturbed atoms or dissociated materials at the interface between print adhesive 12 and rigid substrate 10 reduces the adhesion between the rigid substrate 10 and print adhesive 12. Thus, an interface that is exposed to the electromagnetic radiation 40 becomes dissociated or disturbed and exhibits decreased adhesion between the rigid substrate 10 and print adhesive 12.

In an optional step, a dissociated interface is etched to remove disturbed or decomposed detritus from the interface. In various embodiments of the present invention, the etching is any one or more of liquid etching, gas etching, plasma etching, or inductively coupled plasma etching. The etchant can be a gas, liquid, or plasma. The etchant can be or comprise any one or more of HCl, $Cl_2$, $BCl_3$, $H_2O_2$, $XeF_2$, TMAH (trimethylammonium hydroxide), and oxygen plasma, individually, sequentially, or in any combination.

In certain embodiments, micro-transfer printable micro-elements 24 or micro-devices 20 are provided on a micro-transfer-printable device source wafer. In a method according to some embodiments of the present invention, a stamp is pressed against a micro-device 20 or micro-element 24 to adhere the micro-device 20 or micro-element 24 to the stamp. The stamp can be planar or cylindrical, for example in a roll-to-roll-type process configuration. The stamp is then removed from the micro-transfer-printable device source wafer with micro-devices 20 or micro-elements 24 and transported to a destination substrate such as print adhesive 12 and rigid substrate 10. The removal of micro-devices 20 or micro-elements 24 from the source substrate separates micro-devices 20 or micro-elements 24 from anchors 60. Where the micro-devices 20 or micro-elements 24 are physically connected to anchors 60 with micro-device tethers 28 or micro-element tethers 26, the micro-device or micro-element tethers 28, 26 are broken (e.g., fractured) or separated to release the micro-devices 20 or micro-elements 24 from the source substrate. Micro-devices 20 or micro-elements 24 are then pressed against and adhered to the destination substrate with the stamp and the stamp is removed to micro-transfer print the micro-devices 20 or micro-elements 24 from the source substrate to the destination substrate.

In certain embodiments of micro-transfer printing, micro-structured stamps (e.g., elastomeric, electrostatic stamps, or hybrid elastomeric/electrostatic stamps) can be used to pick up micro-devices 20 or micro-elements 24, transport micro-devices 20 or micro-elements 24 to a destination substrate such as print adhesive 12 on a rigid substrate 10, and print micro-devices 20 or micro-elements 24 onto the destination substrate. In some embodiments, surface adhesion forces are used to control the selection and printing of these micro-devices 20 or micro-elements 24 onto the destination substrate. This process may be performed massively in parallel. A stamp may be designed to transfer a single micro-device 20 or micro-element 24 or hundreds to thousands of discrete structures in a single pick-up and print or roll printing operation. See U.S. Pat. Nos. 7,622,367, 8,722,458, and 8,506,867 for a discussion of micro-transfer printing generally, the disclosure from each of which is hereby incorporated by reference in its entirety. Moreover, these micro-transfer printing techniques may be used to print micro-devices 20 or micro-elements 24 at temperatures compatible with assembly on plastic polymer destination substrates. In addition, semiconductor materials may be printed onto large areas of substrates thereby enabling continuous, high speed printing of complex integrated electrical circuits over large substrate areas.

In some embodiments, at least one anchor 60 is disposed laterally adjacent to each micro-device 20 or micro-element 24. As shown, micro-devices 20 or micro-elements 24 can comprise tethers 28, 26. For example a micro-device substrate 22, micro-element substrate, or a patterned dielectric structure 400 can define a micro-device or micro-element tether 28, 26 that physically connects a micro-device 20 or micro-element 24 to an anchor 60.

In some embodiments of the present invention, at least one anchor 60 is disposed between a micro-device 20 or micro-element 24 and a source substrate, for example beneath micro-device 20 or micro-element 24. Disposing an anchor 60 beneath a micro-device 20 or micro-element 24 enables a higher density of micro-devices 20 or micro-elements 24 to be disposed on a micro-transfer-printable device source wafer, since anchors 60 do not occupy space on the wafer as when laterally disposed between micro-devices 20 or micro-elements 24.

In some embodiments of the present invention, micro-devices 20 or micro-elements 24 comprise one or more semiconductor layers formed on a micro-device substrate 22 or a micro-element substrate. Semiconductor layer(s) can include an n-doped semiconductor layer (also known as an n-type semiconductor layer). A p-doped semiconductor layer (also known as a p-type semiconductor layer) can be deposited on the n-doped semiconductor layer. In some embodiments of the present invention, the n- and p-doped semiconductor layers are compound semiconductor layers such as III-V or II-VI semiconductor layers (for example, GaN). Other semiconductors and compound semiconductors are contemplated in certain embodiments of the present invention. The p-doped semiconductor layer can be thinner than the n-doped semiconductor layer. Micro-devices 20 or micro-elements 24 can be or comprise light-emitting diodes.

N-doped and p-doped semiconductor layers or other device materials can be disposed on a micro-device substrate 22 or micro-element substrate, in some embodiments, by forming crystalline layers using molecular beam epitaxy (MBE), metal organic chemical vapor deposition (MOCVD) or other epitaxial, chemical vapor deposition, or atomic layer deposition techniques, for example. In some embodiments, n-doped and p-doped semiconductor layers are further processed to provide crystalline semiconductor layers. Other materials can be deposited by evaporation, sputtering, or coating, for example.

In some embodiments, n-doped and p-doped semiconductor layers are crystalline GaN. The GaN material can be doped, for example, with magnesium to form a p-type semiconductor layer or with silicon or oxygen to form an n-type semiconductor layer. The n-doped and p-doped semiconductor layers can be formed having sub-layers with different concentrations of different material, for example, to provide different sub-layers having different electrical properties. In some embodiments, semiconductor layers include a current-transport semiconductor layer doped to provide increased electrical conductivity or transparency and one or more other semiconductor layers are doped to provide light-emitting properties in response to an electrical current passing through the semiconductor crystal (e.g., n-doped and p-doped semiconductor layers).

Micro-device contact pads 420 can be electrically conductive, can be electrically connected to an electrode 410. Micro-device contact pads 420 or electrodes 410 can supply current to a micro-device 20 or semiconductor layers (or be used to extract current from a micro-device 20, e.g., if it is a photovoltaic micro-device). Micro-device contact pads 420 or electrodes 410 can be a single layer or can include multiple sub-layers. Micro-device contact pads 420 or electrodes 410 can be transparent, semi-transparent, or reflective and can include conductive materials such as metal oxides, indium tin oxide, aluminum zinc oxide, metals, silver, tin, aluminum, gold, titanium, tantalum, nickel, tin, platinum, palladium, or combinations or alloys thereof of these or other conductive materials. Micro-device contact pads 420 or electrodes 410 can include conductive polymers and can be formed using physical vapor deposition, annealing, or photolithographic processing.

At times, the present disclosure describes formation of a single micro-device 20 or micro-element 24. The same techniques and methods may be used to form arrays of these elements, devices, and/or structures such that multiple micro-devices 20 or micro-elements 24 may be micro transfer printed to a destination substrate (e.g., a layer of print adhesive 12 on a rigid substrate 10) from a single source wafer using a planar or rotary stamp. Thus, the present disclosure contemplates the formation and micro-transfer printing of arrays of micro-devices 20 or micro-elements 24 on a source substrate using the methods and techniques described herein (e.g., as described in relation to a single micro-device 20 or micro-element 24). When formation of a single structure is described herein, it is contemplated that the same steps may be performed to an array of structures at the same time, thereby enabling the formation of arrays of micro-devices 20 or micro-elements 24 for micro-transfer printing to a destination substrate. For example, micro-LEDs can be formed on their native substrate with a resolution of approximately 3000 micro-LEDs per square inch (e.g., 2500-3100 or 2900-3500 micro-LEDs per square inch). Micro-devices 20 or micro-elements 24 can have at least one of a length and width of no more than 5, no more than 10, no more than 15, no more than 20, no more than 30, no more than 50, no more than 100, no more than 250, or no more than 500 µm. In certain embodiments, micro-devices 20 and/or micro-elements 24 have a width from 1-8 µm, 8-16 µm, or 16-50 µm. In certain embodiments, micro-devices 20 and/or micro-elements 24 have a length from 5-10 µm, 10-20 µm, 20-50 µm, or 50-250 µm. In certain embodiments, micro-devices 20 and/or micro-elements 24 have a height (thickness or depth) from 0.5-3 µm, 3-10 µm, or 10-25 µm.

According to various embodiments, flexible devices 99, for example as used in a display or sensor array, include a variety of designs having a variety of resolutions, micro-device 20 sizes, and a range of flexible substrate 30 areas. For example, flexible substrate 30 areas ranging from 1 cm by 1 cm to 1 m by 1 m (or larger) in size are contemplated. In general, larger micro-devices 20 are most useful with, but are not limited to, larger flexible substrate 30 areas. The resolution of micro-devices 20 over a flexible substrate 30 can also vary, for example from 50 micro-devices 20 per inch to hundreds of micro-devices 20 per inch, or even thousands of micro-devices 20 per inch. For example, a three-color display can have one thousand 10 µm×10 µm micro-devices 20 per inch (on a 25-micron pitch). Thus, certain embodiments of the present invention have application in both low-resolution and very high-resolution displays or sensor arrays. Flexible devices 99 as disclosed herein have been successfully constructed.

In some embodiments, micro-devices 20 are separately formed in a semiconductor wafer. The micro-devices 20 are then removed from the wafer and transferred, for example using micro transfer printing, to a print adhesive 12 layer on a rigid substrate 10. Such a method has the advantage of enabling use of a crystalline semiconductor substrate that provides higher-performance integrated circuit components than can be made in the amorphous or polysilicon semiconductor available on a large substrate such as the flexible substrate 30. Furthermore, in certain embodiments, the relatively small size of micro-devices 20 compared to the relatively large size of a flexible substrate 30 enables flexibility in a flexible device 99, even when the micro-devices 20 themselves are relatively rigid compared to the flexible substrate 30. Moreover, micro-devices 20 comprising monocrystalline silicon have a much greater electronic or opto-electronic performance than flexible circuits made using relatively large printed organic electronic structures and materials.

In certain embodiments, by employing a multi-step transfer or assembly process, increased yields are achieved and thus production costs for flexible devices 99 or device structures 98 are reduced. Additional details useful in understanding and performing aspects of certain embodiments of the present invention are described in U.S. Pat. No. 9,520,537 filed Jun. 18, 2015, entitled Micro-Assembled Micro LED Displays and Lighting Elements.

In an exemplary method according to certain embodiments of the present invention, micro-elements 24 are formed and disposed on a micro-device substrate 22 and the micro-device 20 is subsequently disposed on a print adhesive 12 layer on a rigid substrate 10 by micro transfer printing using compound micro assembly structures and methods, for example as described in U.S. patent application Ser. No. 14/822,868 filed Aug. 10, 2015, entitled Compound Micro-Assembly Strategies and Devices.

As is understood by those skilled in the art, the terms "over" and "under" are relative terms and can be interchanged in reference to different orientations of the layers, elements, and substrates included in the present invention. For example, a first layer on a second layer, in some implementations means a first layer directly on and in contact with a second layer. In other implementations a first layer on a second layer includes a first layer and a second layer with another layer therebetween.

Having described certain implementations of embodiments, it will now become apparent to one of skill in the art that other implementations incorporating the concepts of the disclosure may be used. Therefore, the disclosure should not be limited to certain implementations, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

PARTS LIST

10 rigid substrate
12 print adhesive
14 bonding layer
20 micro-device
21 micro-device source wafer/micro-device source substrate
22 micro-device substrate 23 back side
24 micro-element
24R red light emitting diode
24G green light emitting diode
24B blue light emitting diode
24C micro-controller
26 micro-element tether
27 semiconductor device/integrated circuit
28 micro-device tether
30 flexible substrate
32 sacrificial portion
40 electromagnetic radiation
43 micro-controller circuit
50 electrical conductor
52 via
54 electrical connection
58 micro-device wires
60 anchor
80 carrier substrate
98 device structure
99 flexible device
100 provide rigid substrate step
110 provide flexible substrate step
120 provide micro-device source wafer step
130 dispose print adhesive step
140 provide bonding layer step
150 micro-transfer print micro-device from micro-device source wafer to print adhesive step
155 coat bonding layer over micro-device step
160 bond flexible substrate to micro-device step
165 form flexible substrate on micro-devices step
170 separate flexible substrate and micro-devices from rigid substrate step
175 expose print adhesive to laser step
177 separate rigid substrate from micro-devices and flexible substrate step
180 remove remaining print adhesive
190 process exposed back side
200 provide micro-element source wafer step
210 provide micro-device source wafer step
220 micro-transfer print micro-element from micro-element source wafer to micro-device substrate step
300 provide carrier substrate step
310 temporarily bond flexible substrate to carrier substrate step
320 separate carrier substrate from flexible substrate step
330 form electrical conductors step
340 form vias in bonding layer step
350 electrically connect micro-devices to electrical conductors step
360 form electrical conductors on bonding layer step
400 patterned dielectric structure
410 electrode
420 micro-device contact pad
430 connection post
440 micro-device circuit
470 light shield

What is claimed:

1. A method of making a flexible device, comprising:
providing a rigid substrate and a flexible substrate;
disposing a layer of print adhesive on the rigid substrate;
transfer printing micro-devices onto the print adhesive,
wherein each of the micro-devices comprises a micro-device substrate separate, independent, and distinct from the rigid substrate and from the flexible substrate;
providing a bonding layer;
bonding the flexible substrate to the micro-devices with the bonding layer such that (i) the bonding layer is disposed between the flexible substrate and the micro-devices and (ii) the micro-devices are disposed between the rigid substrate and the flexible substrate; and
separating the flexible substrate from the rigid substrate so that the micro-devices remain bonded to the flexible substrate,
wherein separating the flexible substrate from the rigid substrate comprises exposing the print adhesive to electromagnetic radiation and dissociating the rigid substrate from the micro-devices, from the bonding layer, and from the bonded flexible substrate.

2. The method of claim 1, wherein the rigid substrate is glass, quartz, sapphire, or a semiconductor, wherein the flexible substrate is plastic, or wherein the rigid substrate is glass, quartz, sapphire, or a semiconductor and the flexible substrate is plastic.

3. The method of claim 1, wherein the micro-devices comprise a first micro-device comprising one or more first material(s) and a second micro-device comprising one or more second material(s) that are different from the one or more first material(s).

4. The method of claim 1, wherein each of the micro-devices comprises at least a portion of a micro-device tether.

5. The method of claim 1, comprising micro-transfer printing each micro-device from a native micro-device source wafer to the print adhesive disposed on the rigid substrate, thereby breaking or separating at least one micro-device tether,
wherein, prior to the micro-transfer printing, each of the micro-devices is physically connected to the native micro-device source wafer by the at least one micro-device tether.

6. The method of claim 1, wherein each of the micro-devices is an inorganic micro-light-emitting diode (micro-iLED) and the micro-device substrate is a micro-iLED substrate separate, independent, and distinct from the rigid substrate, from the flexible substrate, and from any other micro-iLED substrate.

7. The method of claim 1, wherein each of the micro-devices comprises two or more micro-elements disposed on the micro-device substrate and each of the two or more micro-elements comprises a micro-element substrate separate, independent, and distinct from the rigid substrate, from the flexible substrate, from the micro-device substrate, and from any other micro-element substrate.

8. The method of claim 7, wherein each micro-element of the one or more micro-elements comprises at least a portion of a micro-element tether.

9. The method of claim 8, comprising micro-transfer printing each of the one or more micro-elements from a native micro-element source wafer to the micro-device substrate, thereby breaking or separating at least one micro-element tether,
wherein, prior to the micro-transfer printing, each of the one or more micro-elements is physically connected to the native micro-element source wafer by the at least one micro-element tether.

10. The method of claim 9, comprising micro-transfer printing each micro-device from a native micro-device source wafer to the print adhesive, thereby breaking or separating at least one micro-device tether,
wherein, prior to the micro-transfer printing, each micro-device is physically connected to a native micro-device source wafer with the at least one micro-device tether.

11. The method of claim 7, wherein the micro-devices are pixels and one or more of the one or more micro-elements are inorganic micro-light-emitting diodes (micro-iLEDs), and for each of the one or more micro-elements that is an inorganic micro-iLED, the micro-element substrate is a micro-iLED substrate separate, independent, and distinct from the rigid substrate, from the flexible substrate, from the pixel substrate, and from any other micro-iLED substrate.

12. The method of claim 11, wherein each of the micro-devices comprises a micro-controller and the method comprises micro-transfer printing the micro-controller from a native micro-controller source wafer to the micro-device substrate of the micro-device, thereby breaking at least one micro-controller tether or separating at least one micro-controller tether,
   wherein, prior to the micro-transfer printing the micro-controller is physically connected to a native micro-controller source wafer with the at least one micro-controller tether and the micro-controller comprises a micro-controller substrate separate, independent, and distinct from the rigid substrate, from the flexible substrate, from the micro-device substrate, from any micro-iLED substrate, and from any other micro-controller substrate.

13. The method of claim 7, wherein the one or more micro-elements comprises a first micro-element comprising one or more first material(s) and a second micro-element comprising one or more second material(s) that are different from the one or more first material(s).

14. The method of claim 1, comprising disposing electrical conductors on the flexible substrate.

15. The method of claim 14, wherein each of the micro-devices comprises one or more connection posts extending away from the micro-device substrate and electrically connected to a micro-device circuit and the method comprises electrically connecting each connection post of the one or more connection posts to an electrical conductor of the electrical conductors by transfer printing and bonding the micro-devices to the flexible substrate.

16. The method of claim 15, wherein, for each of the micro-devices, the micro-device comprises electrical contacts electrically connected to the micro-device circuit and the method comprises electrically connecting the electrical contacts of each of the micro-devices to the electrical conductors on the flexible substrate.

17. The method of claim 16, comprising forming vias through the bonding layer and forming at least one electrical connection through the vias.

18. The method of claim 1, wherein the micro-devices each comprise micro-device contact pads and the method comprises disposing electrical conductors on the bonding layer and electrically connecting the electrical conductors to the micro-device contact pads.

19. The method of claim 1, wherein transfer printing the micro-devices onto the print adhesive comprises micro-transfer printing the micro-devices onto the print adhesive.

20. The method of claim 1, wherein the print adhesive is an epoxy.

21. A method of making a flexible device, comprising:
   providing a rigid substrate and a flexible substrate;
   disposing a layer of print adhesive on the rigid substrate;
   transfer printing micro-devices onto the print adhesive, wherein each of the micro-devices comprises a micro-device substrate separate, independent, and distinct from the rigid substrate and from the flexible substrate;
   providing a bonding layer;
   bonding the flexible substrate to the micro-devices with the bonding layer such that (i) the bonding layer is disposed between the flexible substrate and the micro-devices and (ii) the micro-devices are disposed between the rigid substrate and the flexible substrate; and
   separating the flexible substrate from the rigid substrate so that the micro-devices remain bonded to the flexible substrate,
   wherein each of the micro-devices comprises two or more micro-elements disposed on the micro-device substrate and each of the one or more micro-elements comprises a micro-element substrate separate, independent, and distinct from the rigid substrate, from the flexible substrate, from the micro-device substrate, and from any other micro-element substrate.

* * * * *